United States Patent
Nguyen et al.

(10) Patent No.: US 10,020,430 B2
(45) Date of Patent: Jul. 10, 2018

(54) PHOSPHOR WITH PREFERRED ORIENTATION, FABRICATING METHOD THEREOF, AND LIGHT-EMITTING ELEMENT PACKAGE STRUCTURE EMPLOYING THE SAME

(71) Applicant: LEXTAR ELECTRONICS CORPORATION, Hsinchu (TW)

(72) Inventors: Hoang Duy Nguyen, Taipei (TW); Ren Hong Wang, Taichung (TW); Chaochin Su, Taoyuan (TW); Ru-Shi Liu, New Taipei (TW); Ching-Yi Chen, New Taipei (TW); Yu-Chun Lee, Hsinchu County (TW); Tzong-Liang Tsai, Taichung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 30 days.

(21) Appl. No.: 15/162,531

(22) Filed: May 23, 2016

(65) Prior Publication Data

US 2016/0359090 A1 Dec. 8, 2016

Related U.S. Application Data

(60) Provisional application No. 62/170,832, filed on Jun. 4, 2015, provisional application No. 62/182,769, filed on Jun. 22, 2015.

(30) Foreign Application Priority Data

Oct. 29, 2015 (TW) .............................. 104135543 A

(51) Int. Cl.
*H01L 33/50* (2010.01)
*C09K 11/67* (2006.01)
*H01L 33/56* (2010.01)

(52) U.S. Cl.
CPC .......... *H01L 33/504* (2013.01); *C09K 11/675* (2013.01); *H01L 33/501* (2013.01);
(Continued)

(58) Field of Classification Search
CPC ...................................................... H01L 33/501
(Continued)

(56) References Cited

U.S. PATENT DOCUMENTS 8,057,706 B1   11/2011   Setlur et al.
8,237,348 B2   8/2012    Masuda et al.
(Continued)

FOREIGN PATENT DOCUMENTS

CN   101705095   5/2010
CN   204375791   6/2015
(Continued)

OTHER PUBLICATIONS

Xianyu Jiang et al., "A Red Phosphor $BaTiF_6:Mn^{4+}$: Reaction Mechanism, Microstructures, Optical Properties, and Applications for White LEDs," Dalton Transactions, Apr. 2014, pp. 9414-9418, vol. 43, The Royal Society of Chemistry, US.
(Continued)

*Primary Examiner* — Moazzam Hossain
*Assistant Examiner* — Omar Mojaddedi

(57) ABSTRACT

The present invention provides a phosphor with a preferred orientation represented by the following formula: $A_2[MF_6]:Mn^{4+}$, wherein A is selected from a group consisting of Li, Na, K, Rb, Cs, and $NH_4$, M is selected from a group consisting of Ge, Si, Sn, Ti, and Zr. The preferred orientation is a (001)/(011) preferred orientation. The present invention also provides a method for fabricating the above phosphor. The present invention further provides a light-emitting element package structure employing the same.

8 Claims, 24 Drawing Sheets

(52) U.S. Cl.
CPC .... *H01L 33/56* (2013.01); *H01L 2224/16245* (2013.01); *H01L 2224/48091* (2013.01); *H01L 2224/48247* (2013.01); *H01L 2224/48257* (2013.01); *H01L 2924/181* (2013.01)

(58) Field of Classification Search
USPC .......................................................... 257/98
See application file for complete search history.

(56) References Cited

U.S. PATENT DOCUMENTS

| | | |
|---|---|---|
| 8,252,613 B1 | 8/2012 | Lyons et al. |
| 8,362,685 B2 | 1/2013 | Masuda et al. |
| 8,491,816 B2 | 7/2013 | Hong et al. |
| 2010/0142189 A1* | 6/2010 | Hong .................. C09K 11/616 362/97.3 |
| 2012/0161170 A1 | 6/2012 | Dubuc et al. |
| 2013/0147343 A1* | 6/2013 | Won .................. C09K 11/7774 313/503 |

FOREIGN PATENT DOCUMENTS

| | | |
|---|---|---|
| EP | 2508586 A2 | 10/2012 |
| EP | 2663611 A1 | 7/2014 |
| TW | 201307527 | 2/2013 |
| WO | WO 2013088313 A1 | 6/2013 |
| WO | WO 2013121355 A1 | 8/2013 |

OTHER PUBLICATIONS

Haomiao Zhu et al., "Highly Efficient Non-Rare-Earth Red Emitting Phosphor for Warm White Light-Emitting Diodes," Nature Communications, Jul. 2014, pp. 1-10, Macmillan Publishers Limited, US.

Lifen Lv et al., "Optimized Photoluminescence of Red Phosphor $K_2TiF_6:Mn^{4+}$ Synthesized at Room Temperature and its Formation Mechanism," Journal of Materials Chemstry C, Dec. 2014, pp. 1935-1941, vol. 3, The Royal Society of Chemistry, US.

Toru Takahashi et al., "$Mn^{4+}$_Activated Red Photoluminescence in $K_2SiF_6$ Phosphor," Journal of the Electrochemical Society, Oct. 2008, pp. E183-E188, vol. 155, issue 12, The Electrochemical Society, US.

Taiwan Patent Office, Office Action, Patent Application Serial No. 104135543, dated Aug. 11, 2016, Taiwan.

* cited by examiner

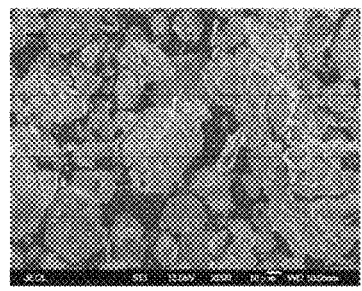
Fig. 10D
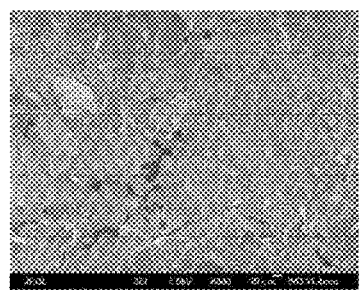 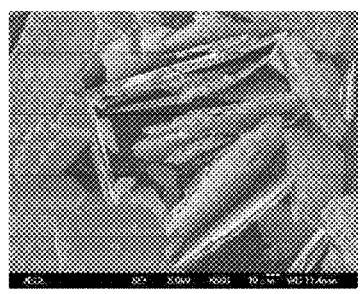
Fig. 10E        Fig. 10F

PHOSPHOR WITH PREFERRED ORIENTATION, FABRICATING METHOD THEREOF, AND LIGHT-EMITTING ELEMENT PACKAGE STRUCTURE EMPLOYING THE SAME

CROSS REFERENCE TO RELATED APPLICATIONS

This application claims the benefit of U.S. Provisional Application No. 62/170,832, filed on Jun. 4, 2015 and U.S. Provisional Application No. 62/182,769, filed on Jun. 22, 2015, the entirety of which are incorporated by reference herein. Also, the present application is based on, and claims priority from, Taiwan (International) Application Serial Number 104135543, filed on Oct. 29, 2015, the disclosure of which is hereby incorporated by reference herein in its entirety.

BACKGROUND OF THE INVENTION

Field of the Invention

The present invention relates to a phosphor with a preferred orientation, a fabricating method thereof, and a light-emitting element package structure employing the same, and in particular it relates to a phosphor with a preferred orientation, which is capable of increasing the color rendering index, a fabricating method thereof, and a light-emitting element package structure employing the same.

Description of the Related Art

In recent years, energy-saving and environmental protection concepts have been a major concern. As new lighting sources, light-emitting diodes (LEDs) can solve problems that cannot be conquered by traditional incandescent lamps or fluorescent lamps. Also, LEDs meet the requirements of having low power consumption and environmental protection. Therefore, issues such as exploiting new energies and increasing energy efficiency have attracted the public's attention. Color LEDs have been used widely in colored lighting, displays, entertainments, and so on. The development of the electronic display industry has been the most rapid. It is believed that LEDs will play an important role in photoelectric element applications in the future.

So far, the development of white light-emitting diodes (WLEDs) is the main developmental direction of LEDs in global. WLEDs have advantages such as small size, low heat radiation, long life, low power consumption, and vibration resistance. WLEDs solve the problems that cannot be conquered by traditional lamps. As traditional energy-consuming and polluting incandescent lamps have been eliminated or prohibited around the world, such as in the European Union, Australia, and America, the uses of LEDs have developed from functional uses such as street lighting, traffic signals, or special household electrical appliances to general use such as household lighting, large displays, automotive lighting, indoor lighting, or the backlight modules of electronic products. As a result, the market penetration rate of LEDs continuously increases at a rate of 10-15% every year. The result further reveals the developmental value of WLEDs in the field of lighting for a new generation.

Many countries are actively involved in the LED industry. So far, it is well known that Nichia (Japan) employs a technique that excites yellow light-emitting phosphor in blue LED chips to improve the luminous efficiency of white light, and with a low manufacturing cost. Also, Cree (America) uses UV to excite phosphors to produce white light. In addition, Siemens and Philips (Europe) use a method of exciting terbium aluminum garnet (TAG; $Tb_3Al_5O_{12}$) in UV chips to produce WLEDs with high luminous efficiency.

One of the most common WLEDs used in the industry include blue LED chips accompanied by YAG phosphor ($Y_3Al_5O_{12}$:Ce; Yttrium aluminum garnet). However, in order to remedy the red light spectrum which YAG phosphor ($Y_3Al_5O_{12}$:Ce; Yttrium aluminum garnet) lacks, the process for the red light-emitting phosphor-added WLEDs has become a new issue. So far, there is lots of information about the synthesis and applications of the red light-emitting phosphor. For example, it is known that $A_2[MF_6]:Mn^{4+}$ (wherein A is Li, Na, K, Rb, Cs, $NH_4$; and M is Ge, Si, Sn, Ti, Zr) fluorides may serve as a red light-emitting phosphor for LEDs. In addition, Xueyuan Chen et al. have also tried to improve the synthesis condition, luminous efficiency, and heat resistance of their published $K_2TiF_6:Mn^{4+}$.

Therefore, for the current progress of LEDs to continue, it is important to provide a red light-emitting phosphor capable of increasing the color rendering index for WLEDs, and a fabricating method thereof.

BRIEF SUMMARY OF THE INVENTION

According to an embodiment, a phosphor with a preferred orientation is provided. The phosphor with a preferred orientation is represented by the following formula: $A_2[MF_6]:Mn^{4+}$. In the formula, A is selected from a group consisting of Li, Na, K, Rb, Cs, and $NH_4$, M is selected from a group consisting of Ge, Si, Sn, Ti, and Zr. The preferred orientation is a (001)/(011) preferred orientation.

According to another embodiment, a method for fabricating a phosphor with a preferred orientation is provided. In an embodiment of the method for fabricating the phosphor with a preferred orientation, a first solution is provided. The first solution is formed by dissolving a hydrofluoride of A and one of $K_2MnF_6$ and $KMnO_4$ in a hydrofluoric acid solution, wherein A is selected from a group consisting of Li, Na, K, Rb, Cs, and $NH_4$. A second solution is provided. The second solution is formed by dissolving a surfactant and an alkoxide precursor of M in a solvent at room temperature, wherein M is selected from a group consisting of tetravalent elements of Ge, Si, Sn, Ti, and Zr. The first solution and the second solution are mixed to form a precipitation. The precipitation is collected after the first solution and the second solution are mixed.

According to another embodiment, a light-emitting element package structure is provided. The light-emitting element package structure includes a base, a light-emitting diode chip disposed in the base, a fluorescent layer covering the light-emitting diode chip, and a conductive structure electrically connected to the light-emitting diode chip, a first electrode, and a second electrode. In one embodiment, a phosphor with a preferred orientation is dispersed in the fluorescent layer. The phosphor with a preferred orientation is formed by the method as described above.

According to yet another embodiment, a light-emitting element package structure is provided. The light-emitting element package structure includes a base, a light-emitting diode chip disposed in the base, a fluorescent layer covering the light-emitting diode chip, and a conductive structure electrically connected to the light-emitting diode chip, a first electrode, and a second electrode. In one embodiment, a phosphor with a preferred orientation is dispersed in the fluorescent layer. The phosphor with a preferred orientation is the phosphor with a preferred orientation as described above.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
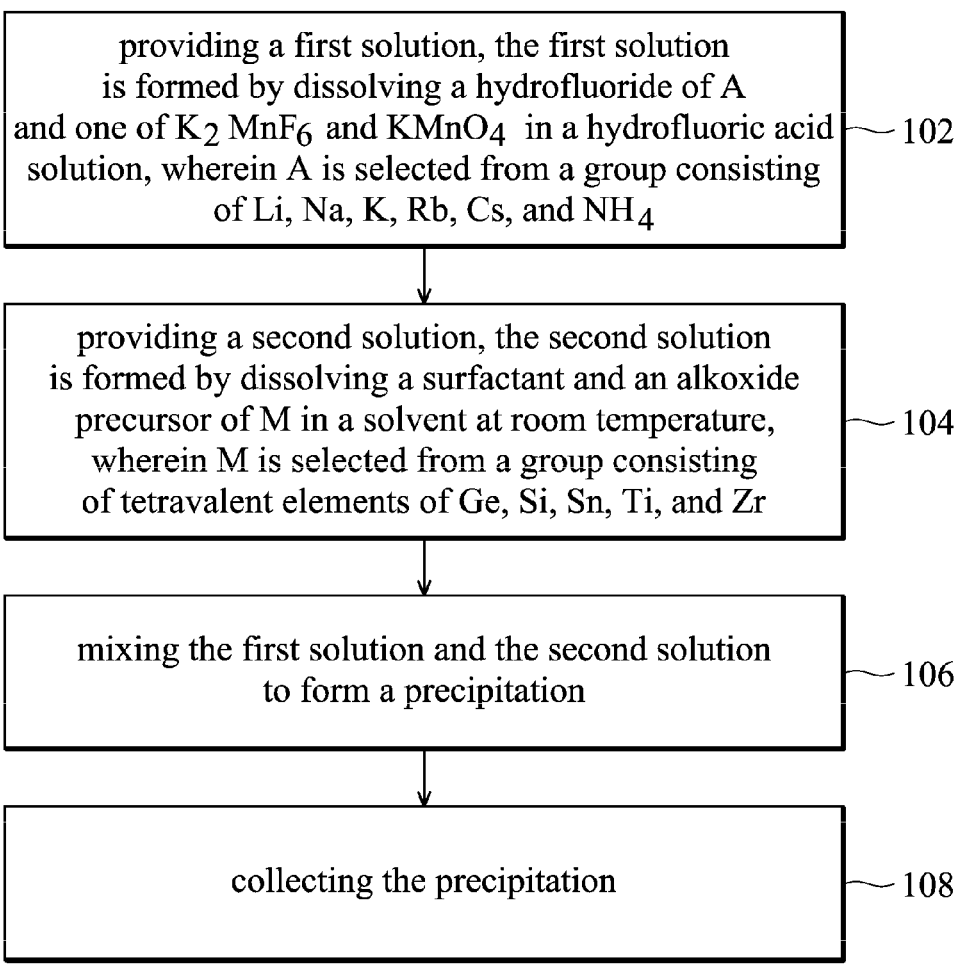
FIG. 1 is a flow diagram illustrating a method for fabricating a phosphor with a preferred orientation in accordance with some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

The present disclosure provides a phosphor capable of increasing the color rendering index and a fabricating method thereof. The present disclosure synthesizes a phosphor with a preferred orientation with high luminous efficiency and quantum output efficiency through a sol-gel reaction by regulating temperature and adding surfactants. The resulting phosphor may be used to enable blue LEDs to produce a red fluorescence. Alternatively, the resulting phosphor may be used to increase the color rendering index for WLEDs. Furthermore, the resulting phosphor may be applied to light-emitting element package structures and backlight modules.

In one embodiment, a phosphor with a preferred orientation is provided. The phosphor with a preferred orientation is represented by the following formula: $A_2[MF_6]$:$Mn^{4+}$. In the formula, A is selected from a group consisting of Li, Na, K, Rb, Cs, and $NH_4$, M is selected from a group consisting of Ge, Si, Sn, Ti, and Zr. In one embodiment, the formula of the phosphor with a preferred orientation may be $K_2[TiF_6]$:$Mn^{4+}$. In one embodiment, the preferred orientation of the phosphor may be a (001)/(011) preferred orientation, and the (001)/(011) preferred orientation may be greater than 10. For example, the (001)/(011) preferred orientation may be greater than 20 or greater than 30. In one embodiment, the phosphor may emit a red light having a peak wavelength in a range of about 600 nm to about 650 nm after being excited by a light having a peak wavelength in a range of about 300 nm to about 470 nm.

It should be noted that the excitation light, which excites the red light-emitting phosphor provided in the present disclosure, has a peak wavelength which does not overlap with the peak wavelength of yellow light (from about 570 nm to about 590 nm). Accordingly, in a lighting apparatus containing an LED, for example, the possibility is low that the yellow light-emitting phosphor-generated yellow light, which is excited by the LED (such as a blue LED), will be absorbed by the red light-emitting phosphor provided in the present disclosure. Therefore, the color rendering index of the lighting apparatus may be increased by avoiding the loss of yellow light and by the red light generated by the red light-emitting phosphor with a preferred orientation provided in the present disclosure. In addition, it should also be noted that the excitation light, which excites the red light-emitting phosphor provided in the present disclosure, has a peak wavelength which does not overlap with the peak wavelength of green light (from about 495 nm to about 570 nm). Accordingly, in a lighting apparatus containing an LED, for example, the possibility is low that the green light-emitting phosphor-generated green light, which is excited by the LED (such as a blue LED), will be absorbed by the red light-emitting phosphor provided in the present disclosure. Therefore, the color rendering index of the lighting apparatus may be increased by avoiding the loss of green light and by the red light generated by the red light-emitting phosphor with a preferred orientation provided in the present disclosure. Therefore, any light having a peak wavelength in the range of about 300 nm to about 470 nm may be used as the excitation light of the phosphor provided in the present disclosure.

In another embodiment, a method for fabricating the above phosphor with a preferred orientation is also provided. FIG. 1 is a flow diagram illustrating a method 100 for fabricating a phosphor with a preferred orientation in accordance with some embodiments of the present disclosure.

Firstly, the method 100 proceeds to step 102 by providing a first solution. The first solution is formed by dissolving a hydrofluoride of A and one of $K_2MnF_6$ and $KMnO_4$ in a hydrofluoric acid solution. A is selected from a group consisting of Li, Na, K, Rb, Cs, and $NH_4$. In step 102, the hydrofluoride of A may include, for example, $LiHF_2$, $NaHF_2$, $KHF_2$, $RbHF_2$, $CsHF_2$, or $NH_4HF_2$. The molarity of the hydrofluoride of A in the first solution may be in a range of about 0.4 mol/L to about 1.35 mol/L. For example, the molarity of the hydrofluoride of A may be 0.4 mol/L, 0.6 mol/L, 1.1 mol/L, or 1.3 mol/L. In addition, in step 102, $K_2MnF_6$ or $KMnO_4$ serves as the source of luminescence center Mn of the resulting phosphor.

In addition, step 102 may be performed at a temperature of in a range of about 0° C. to about 50° C. For example, the temperature may be 0° C., 25° C., or 50° C. It was found that the phosphor fabricated at a lower reaction temperature has a higher quantum output efficiency and luminous efficiency. Therefore, in the embodiments of the present disclosure, the synthesis temperature is preferably reduced to, for example, 10° C. to facilitate producing phosphor with higher quantum output efficiency and luminous efficiency.

Next, the method 100 proceeds to step 104 by providing a second solution. The second solution is formed by dissolving a surfactant and an alkoxide precursor of M in a solvent at room temperature. M is selected from a group consisting of tetravalent elements of Ge, Si, Sn, Ti, and Zr.

The surfactant used in step 104 may include a cationic surfactant, an anionic surfactant, a nonionic surfactant, or a combination thereof. The cationic surfactant may include cetrimonium bromide (CTAB; $(C_{16}H_{33})N(CH_3)_3Br$). The anionic surfactant may include sodium dodecyl sulfate (SDS; $NaC_{12}H_{25}SO_4$). The nonionic surfactant may include oleic acid ($C_{18}H_{34}O_2$) or polyvinylpyrrolidone (PVP; $(C_6H_9NO)_n$). The molarity of the surfactant in the second solution may be in a range of about 0.5 mol/L to about 10 mol/L based on the total volume of the solvent in the second solution. For example, the molarity of the surfactant in the second solution may be 1.0 mol/L, 3.0 mol/L, or 5.0 mol/L based on the total volume of the solvent in the second solution. In one embodiment, the surfactant used in step 104 is sodium dodecyl sulfate (SDS; $NaC_{12}H_{25}SO_4$) and the alkoxide precursor of M used in step 104 is titanium isopropoxide ($TiC_{12}H_{28}O_4$).

The formula of the cationic surfactant cetrimonium bromide (CTAB; $(C_{16}H_{33})N(CH_3)_3Br$) is

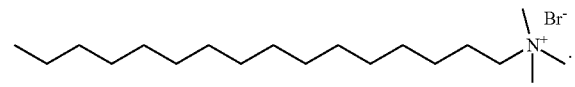 [SMILES: CCCCCCCCCCCCCCCC[N+](C)(C)C ; [Br-]]

The formula of the anionic surfactant sodium dodecyl sulfate (SDS; $NaC_{12}H_{25}SO_4$) is

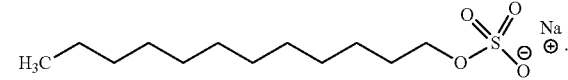 [SMILES: CCCCCCCCCCCCOS(=O)(=O)[O-] ; [Na+]]

The formula of the nonionic surfactant oleic acid ($C_{18}H_{34}O_2$) is

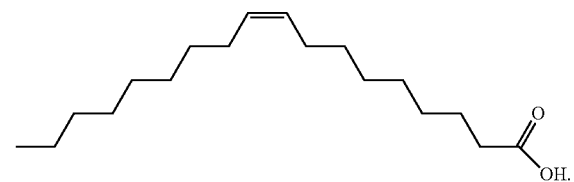 [SMILES: CCCCCCCC/C=C\CCCCCCCC(=O)O]

It should be noted that the present disclosure controls the morphology, for example, the crystalline orientation, of phosphor by adding the above surfactants. Generally, the crystal of phosphor is grown evenly in every orientation. However, in the present disclosure, appropriate amount of surfactants are added to cover the crystal face having a larger area in a specific orientation to impede the crystal growth in said specific orientation. Therefore, the crystal is grown in the non-covered orientation. As a result, a preferred orientation is produced. However, when the amount of surfactants is too much, all crystal faces of phosphor may be covered by the surfactants. In this case, the crystal growth in every orientation may be impeded, so the crystal may not be grown in one specific orientation and the preferred orientation may not be produced. In contrast, when the amount of surfactants is too small, the surfactants covering on the crystal face having a larger area in a specific orientation are not enough to impede the crystal growth in said specific orientation. In this case, therefore, the crystal may not be grown in the specific orientation and the preferred orientation may not be produced.

In addition, the solvent used in step 104 may include isopropanol, methanol, ethanol, acetone, or a combination thereof. Different solvents may be selected depending on different surfactants used. Any appropriate solvent which is capable of dissolving the accompanied surfactant may be used in the present disclosure. The solvent is not limited to the aforementioned specific embodiments.

Next, the method 100 proceeds to step 106 by mixing the first solution and the second solution to form a precipitation. The mixing reaction in step 106 may be performed at a temperature in a range of about 0° C. to about 50° C. For example, the temperature may be 0° C., 25° C., or 50° C.

Finally, the method 100 proceeds to step 108 by collecting the precipitation formed in step 106. The collected precipitation is the $A_2[MF_6]:Mn^{4+}$ phosphor with a preferred orientation described in the present disclosure. In one embodiment, the preferred orientation of $A_2[MF_6]:Mn^{4+}$ phosphor may be a (001)/(011) preferred orientation. For example, the (001)/(011) preferred orientation may be greater than 10. The method for collecting the precipitation may include well-known techniques such as washing, filtration, and dry. In one embodiment, the phosphor may be dried at a temperature in a range of about 40° C. to about 80° C. For example, the temperature may be 50° C. or 60° C.

Figure 2:
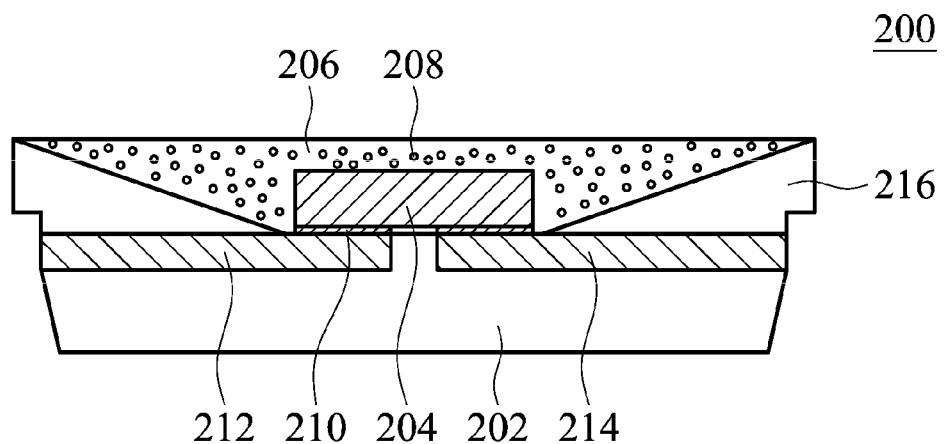
FIGS. 2 and 3 illustrate cross-sectional views of light-emitting element package structures in accordance with some embodiments of the present disclosure.

In another embodiment, as shown in FIG. 2, a light-emitting element package structure 200 is provided. In this embodiment, the light-emitting element package structure 200 is a flip chip package structure, including a base 202, a light-emitting diode chip 204 disposed in the base 202, a fluorescent layer 206 covering the light-emitting diode chip 204, and a conductive structure 210 electrically connected to the light-emitting diode chip 204, a first electrode 212, and a second electrode 214. A phosphor 208 with a preferred orientation is dispersed in the fluorescent layer 206. The light-emitting element package structure 200 may further include a package housing 216 disposed around the base 202. In this embodiment, the conductive structure 210 may include two conductive layers respectively electrically connected to the first electrode 212 and the second electrode 214. In this embodiment, the phosphor 208 with a preferred orientation is the $A_2[MF_6]:Mn^{4+}$ phosphor with a preferred orientation formed by the method 100 described above. The related properties of $A_2[MF_6]:Mn^{4+}$ phosphor are similar to the content described above, and hence is not described again to avoid unnecessary repetition.

Figure 3:
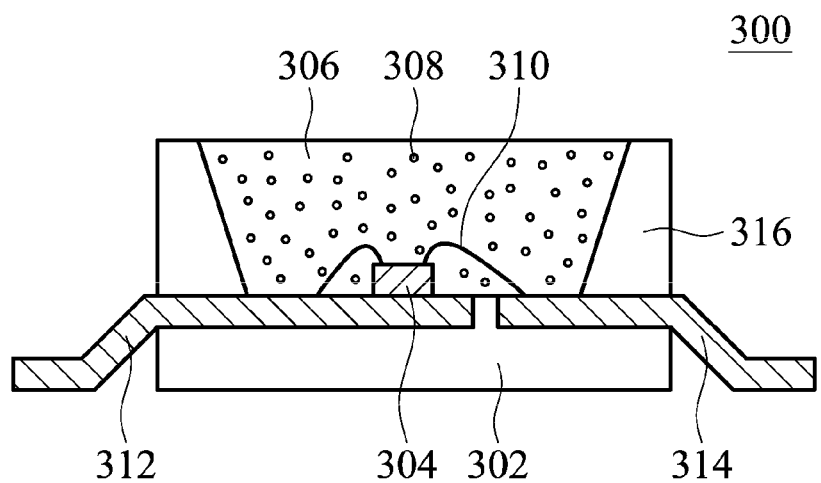

In another embodiment, as shown in FIG. 3, a light-emitting element package structure 300 is provided. In this embodiment, the light-emitting element package structure 300 is a wire bonding package structure, including a base 302, a light-emitting diode chip 304 disposed in the base 302, a fluorescent layer 306 covering the light-emitting diode chip 304, and a conductive structure 310 electrically connected to the light-emitting diode chip 304, a first electrode 312, and a second electrode 314. A phosphor 308 with a preferred orientation is dispersed in the fluorescent layer 306. The light-emitting element package structure 300 may further include a package housing 316 disposed around the base 302. In this embodiment, the conductive structure 310 may include two conductive layers respectively electrically connected to the first electrode 312 and the second electrode 314. In this embodiment, the phosphor 308 with a preferred orientation is the $A_2[MF_6]:Mn^{4+}$ phosphor with a preferred orientation formed by the method 100 described above. The related properties of $A_2[MF_6]:Mn^{4+}$ phosphor are similar to the content described above, and hence is not described again to avoid unnecessary repetition.

It should be realized that the above arrangement and schematic of the lighting apparatus is merely examples of the present disclosure. The present disclosure is not limited thereto. It will be apparent to those skilled in the art that various modifications and variations can be made to the disclosed embodiments.

In one embodiment, the $A_2[MF_6]:Mn^{4+}$ phosphor with a preferred orientation of the present disclosure may be blended with other phosphors. For example, it may be blended with a yellow light-emitting phosphor (such as a YAG yellow light-emitting phosphor or a silicate yellow light-emitting phosphor) and/or a green light-emitting phosphor (such as a β-SiAlON green light-emitting phosphor, a YAG green light-emitting phosphor, a silicate green light-emitting phosphor, or a nitride green light-emitting phosphor). The yellow light-emitting phosphor and/or the green light-emitting phosphor may be blended with the red light-emitting phosphor with a preferred orientation provided in the present disclosure to emit white light after being excited by blue light. In the blended phosphor, the ratio of the yellow light-emitting phosphor, the green light-emitting phosphor, and the red light-emitting phosphor is not limited. The ratio of any two of the blended phosphor may be in a range of 1:99 to 99:1. For example, the ratio of the yellow light-emitting phosphor, the green light-emitting phosphor, and the red light-emitting phosphor may be 1:1:1. The above ratio may be adjusted according to the actual need and the desired properties of the phosphor. The wavelength of the blue light which serves as the excitation light may be in a range of about 400 nm to about 500 nm, preferably from about 440 nm to about 480 nm. It should be noted that the excitation light, which excites the red light-emitting phosphor provided in the present disclosure, has a peak wavelength which does not overlap with the peak wavelength of yellow light (from about 570 nm to about 590 nm) and the peak wavelength of green light (from about 495 nm to about 570 nm). Accordingly, in a lighting apparatus such as an LED (for example, a blue LED) containing yellow light-emitting and/or green light-emitting luminescent materials, the color rendering index of the lighting apparatus may be increased by avoiding the loss of yellow light and/or green light and by the red light generated by the red light-emitting phosphor with a preferred orientation provided in the present disclosure.

In addition, the blue LED chip accompanied blended phosphor may be applied to various types of packages. For example, the various types of packages may include a plastic leaded chip carrier (PLCC), a chip scale package (CSP), an emitter package, a remote-type package, or a white well-type package. In addition, the aforementioned blending of the $A_2[MF_6]:Mn^{4+}$ phosphor with a preferred orientation of the present disclosure and other phosphors may be achieved by simultaneously dispersing both of the $A_2[MF_6]:Mn^{4+}$ phosphor with a preferred orientation and other phosphors in one fluorescent layer of the light-emitting element package structure or by respectively dispersing the $A_2[MF_6]:Mn^{4+}$ phosphor with a preferred orientation and other phosphors in two different fluorescent layers of the light-emitting element package structure. FIGS. 4-8 illustrate cross-sectional views of different types of packages accompanied by blended phosphor in accordance with some embodiments of the present disclosure. Some components are omitted in FIGS. 4-8 for purposes of clarity.

Figure 4:
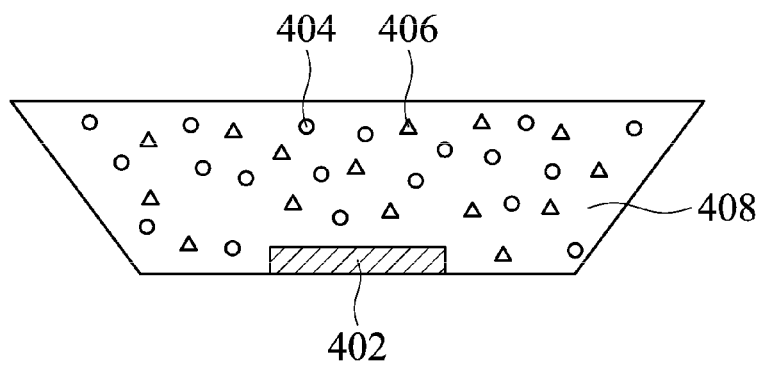
FIG. 4 illustrates a cross-sectional view of a plastic leaded chip carrier (PLCC) accompanied by blended phosphor in accordance with one embodiment of the present disclosure.

As shown in FIG. 4, according to one embodiment of the present disclosure, in the plastic leaded chip carrier (PLCC), a blue LED chip 402 is accompanied by the red light-emitting phosphor 404 with a preferred orientation provided by the present disclosure to excite the green light-emitting phosphor 406. The red light-emitting phosphor 404 and the green light-emitting phosphor 406 are simultaneously dispersed in one fluorescent layer 408 of the light-emitting element package structure.

Figure 5A:
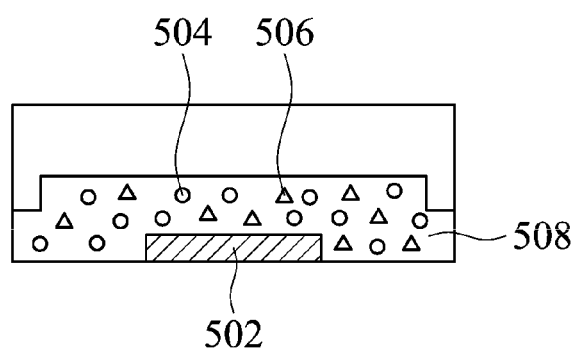
FIGS. 5A and 5B illustrate cross-sectional views of a chip scale package (CSP) accompanied by blended phosphor in accordance with some embodiments of the present disclosure.
Figure 5B:
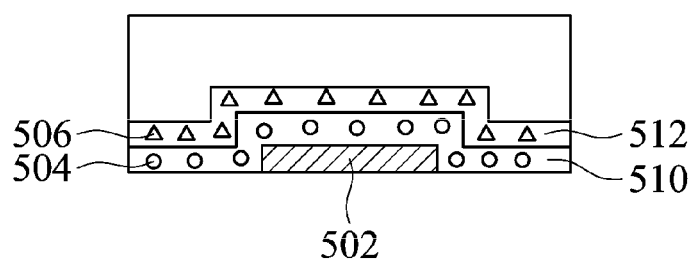

As shown in FIG. 5A, according to one embodiment of the present disclosure, in the chip scale package (CSP), a blue LED chip 502 is accompanied by the red light-emitting phosphor 504 with a preferred orientation provided by the present disclosure to excite the green light-emitting phosphor 506. The red light-emitting phosphor 504 and the green light-emitting phosphor 506 are simultaneously dispersed in one fluorescent layer 508 of the light-emitting element package structure. The differences between FIG. 5B and FIG. 5A are that, in the embodiment shown in FIG. 5B, the red light-emitting phosphor 504 and the green light-emitting phosphor 506 are respectively dispersed in two different fluorescent layers 510, 512 of the light-emitting element package structure.

Figure 6A:
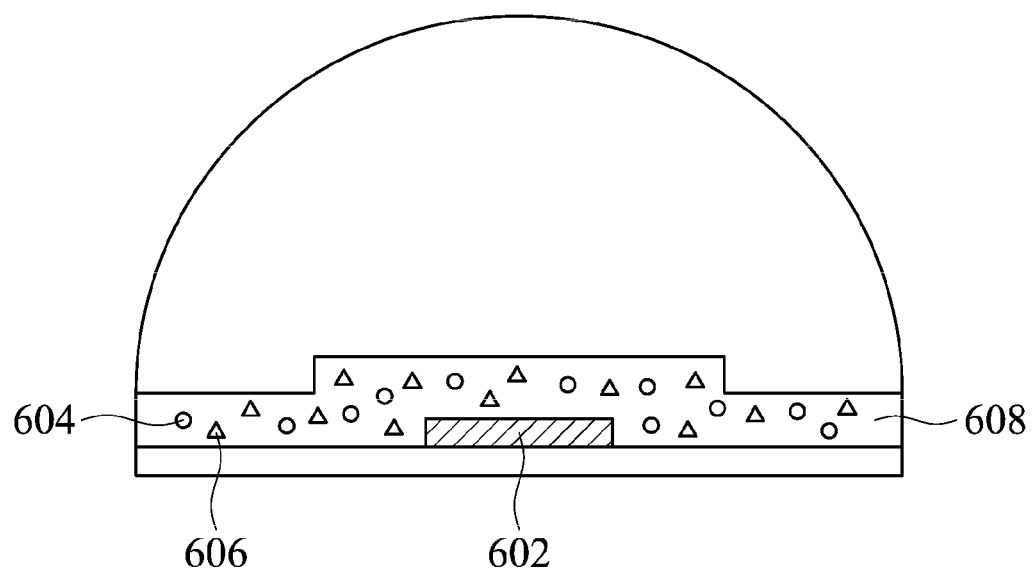
FIGS. 6A and 6B illustrate cross-sectional views of a emitter package accompanied by blended phosphor in accordance with some embodiments of the present disclosure.
Figure 6B:
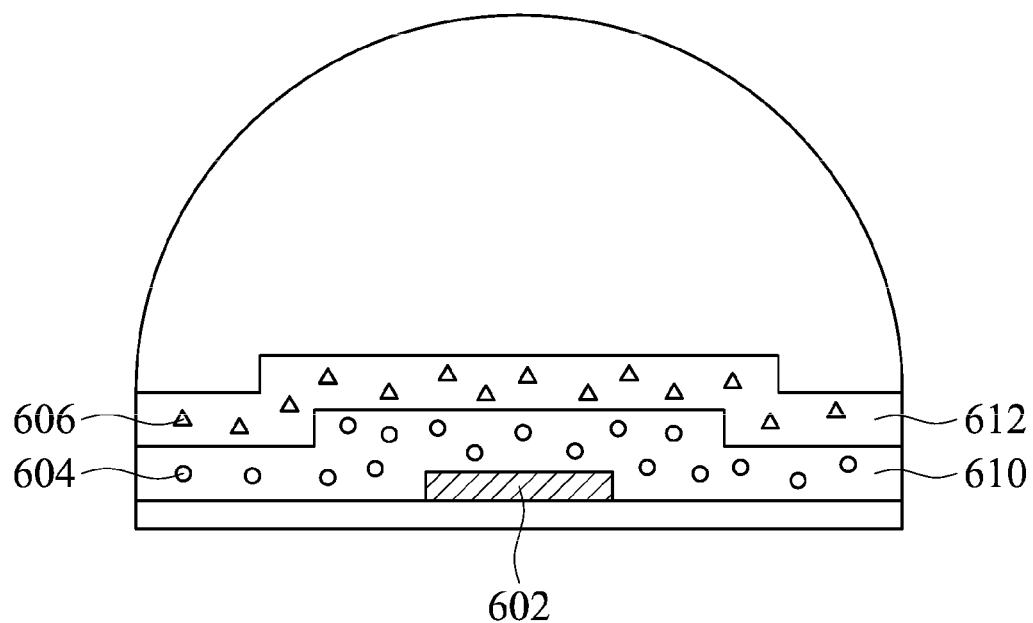

As shown in FIG. 6A, according to one embodiment of the present disclosure, in the emitter package, a blue LED chip 602 is accompanied by the red light-emitting phosphor 604 with a preferred orientation provided by the present disclosure to excite the green light-emitting phosphor 606. The red light-emitting phosphor 604 and the green light-emitting phosphor 606 are simultaneously dispersed in one fluorescent layer 608 of the light-emitting element package structure. The differences between FIG. 6B and FIG. 6A are that, in the embodiment shown in FIG. 6B, the red light-emitting phosphor 604 and the green light-emitting phosphor 606 are respectively dispersed in two different fluorescent layers 610, 612 of the light-emitting element package structure.

Figure 7A:
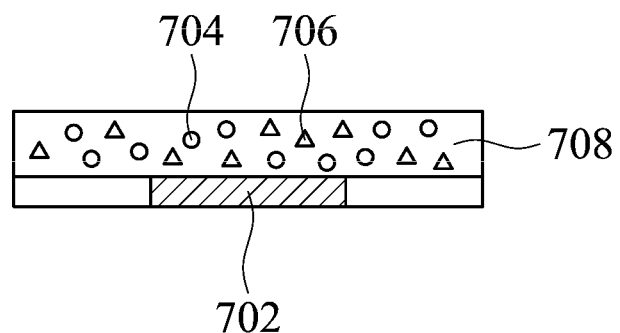
FIGS. 7A and 7C illustrate cross-sectional views of a white wall package accompanied by blended phosphor in accordance with some embodiments of the present disclosure.
Figure 7B:
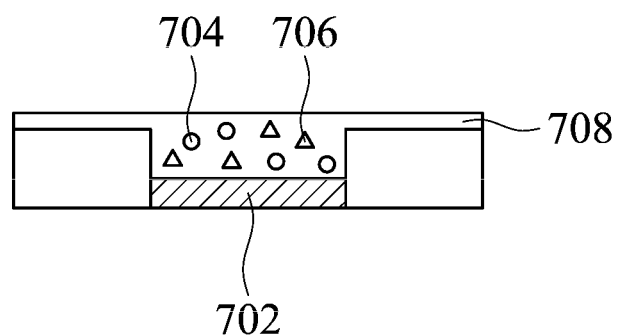
FIGS. 7B and 7D illustrate cross-sectional views of another type of white wall package accompanied by blended phosphor in accordance with some embodiments of the present disclosure.
Figure 7C:
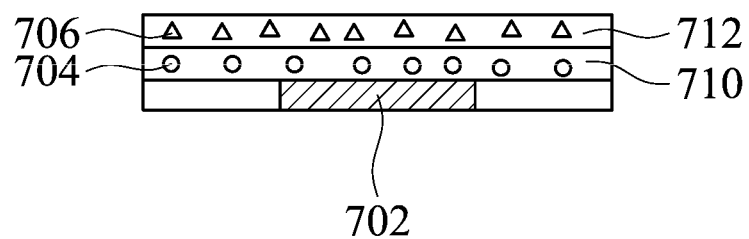
Figure 7D:
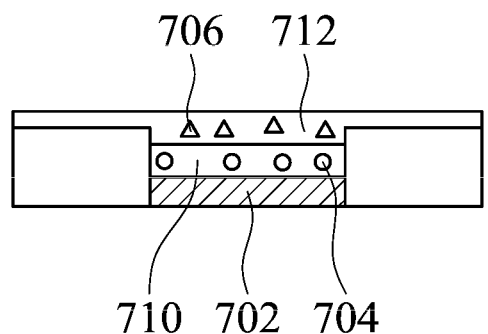

As shown in FIG. 7A, according to one embodiment of the present disclosure, in the white wall package, a blue LED chip 702 is accompanied by the red light-emitting phosphor 704 with a preferred orientation provided by the present disclosure to excite the green light-emitting phosphor 706. The red light-emitting phosphor 704 and the green light-emitting phosphor 706 are simultaneously dispersed in one fluorescent layer 708 of the light-emitting element package structure. Similar to FIG. 7A, FIG. 7B illustrates another type of white wall package. The differences between FIG. 7C and FIG. 7A are that, in the embodiment shown in FIG. 7C, the red light-emitting phosphor 704 and the green light-emitting phosphor 706 are respectively dispersed in two different fluorescent layers 710, 712 of the light-emitting element package structure. Similar to FIG. 7C, FIG. 7D illustrates another type of white wall package.

Figure 8A:
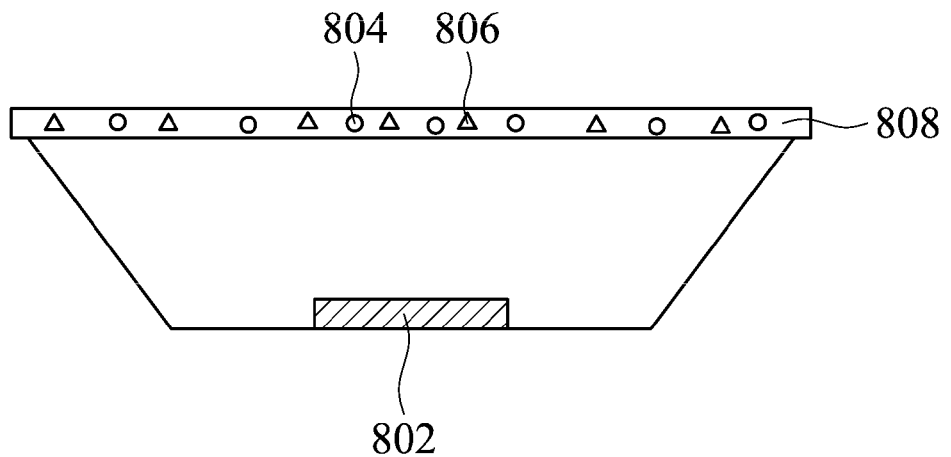
FIGS. 8A and 8B illustrate cross-sectional views of different types of remote-type packages accompanied by blended phosphor in accordance with some embodiments of the present disclosure.
Figure 8B:
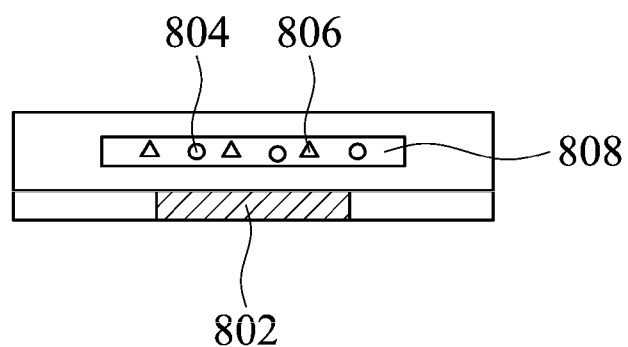

As shown in FIG. 8A, according to one embodiment of the present disclosure, in the remote-type package, a blue LED chip 802 is accompanied by the red light-emitting phosphor 804 with a preferred orientation provided by the present disclosure to excite the green light-emitting phosphor 806. The red light-emitting phosphor 804 and the green light-emitting phosphor 806 are simultaneously dispersed in one fluorescent layer 808 of the light-emitting element package structure. Similar to FIG. 8A, FIG. 8B illustrates another type of remote-type package.

In some other embodiments, a backlight module including the above red light-emitting phosphor with a preferred orientation is also provided. The backlight module includes a side-edge backlight module, a direct-light type backlight module, or so on. In some other embodiments, a lighting module including the above red light-emitting phosphor with a preferred orientation is further provided. The lighting module includes fluorescent tubes, lamps, down lights, panel lights, light boxes, and so on. In the aforementioned backlight module or lighting module, the red light-emitting phosphor may be further blended with other phosphors. The description of the other phosphors may refer to the description in related paragraphs, and hence is not described again to avoid unnecessary repetition.

The Preparation Examples and Examples are described below to illustrate the method for fabricating the phosphor, and the structures and properties of the phosphor.

Preparation Examples 1-3: Fabricating $K_2TiF_6$:$Mn^{4+}$ Phosphors at Different Reaction Temperatures 1 g of $KHF_2$ and 0.11 g of $K_2MnF_6$ were dissolved in 9 mL, 40 wt % of hydrofluoric acid (HF) aqueous solution at 0° C., 25° C., 50° C. and stirred for 15 minutes to form a first solution. On the other hand, 2 mL of titanium isopropoxide ($TiC_{12}H_{28}O_4$) was dissolved in 4.5 mL of isopropanol at room temperature and stirred for 30 minutes to form a second solution. Then, the first solution and the second solution were mixed at 0° C., 25° C., 50° C. and stirred for 15 minutes to produce a precipitation. Afterwards, after being washed twice by 30 mL of ethanol and washed once by 30 mL of acetone, the precipitation was oven-dried at 60° C. for 2 hours. Then, $K_2TiF_6$:$Mn^{4+}$ phosphor was obtained.

Figure 9A:
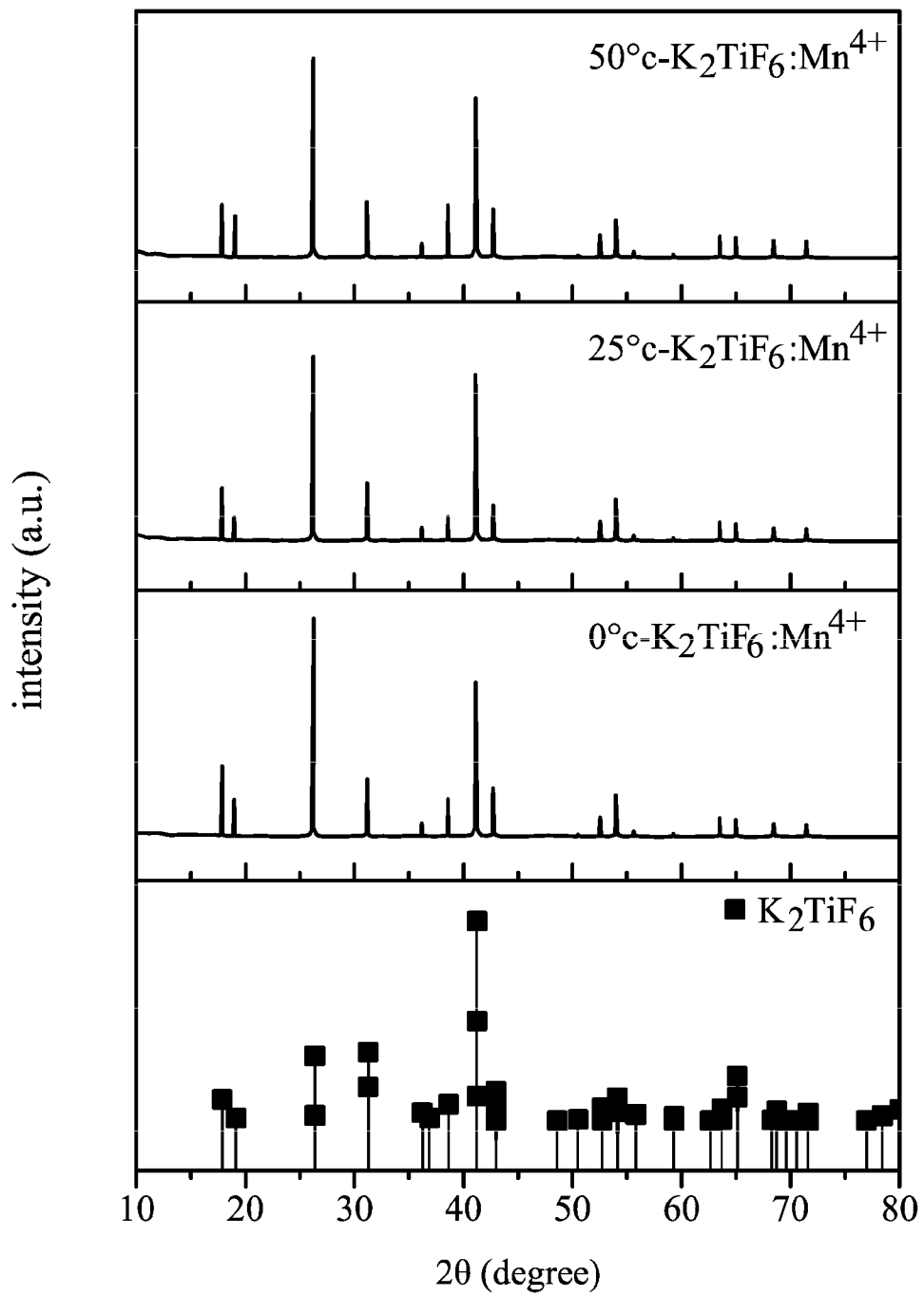
FIG. 9A illustrates X-ray diffraction (XRD) patterns of $K_2TiF_6$:$Mn^{4+}$ phosphor obtained at different heating temperatures in accordance with some embodiments of the present disclosure.
Figure 9B:
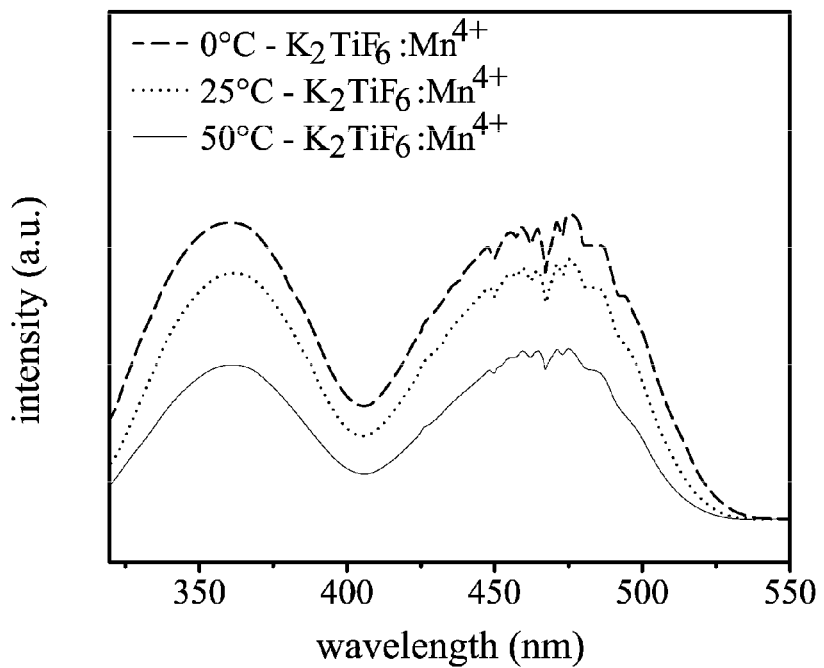
FIG. 9B and FIG. 9C respectively illustrates PLE patterns and PE patterns of $K_2TiF_6$:$Mn^{4+}$ phosphor obtained at different heating temperatures in accordance with some embodiments of the present disclosure.
Figure 9C:
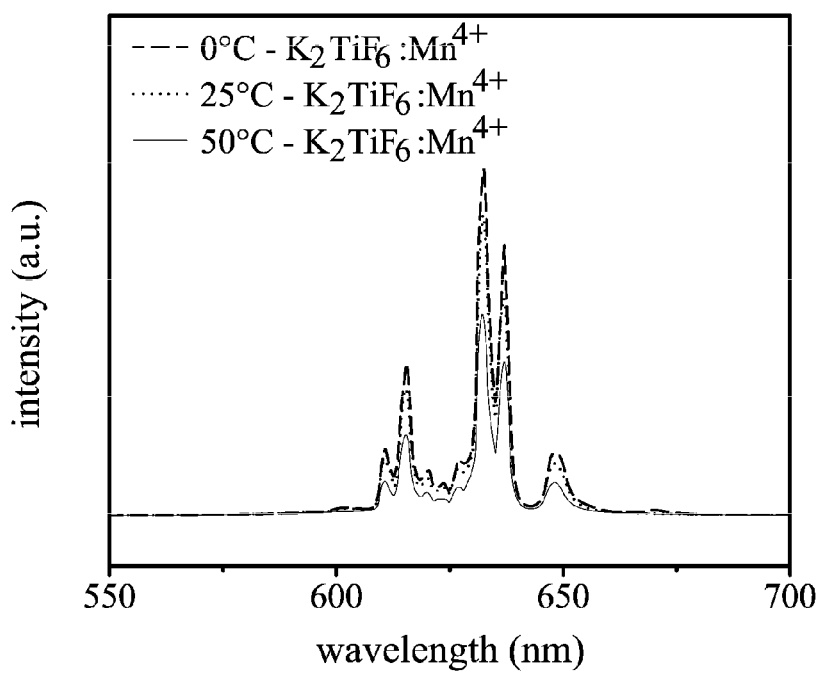

The X-ray diffraction (XRD) patterns of $K_2TiF_6$:$Mn^{4+}$ phosphors of Preparation Examples 1-3 which were respectively obtained at 0° C., 25° C., and 50° C. were recorded with an X-ray powder diffractometer. The results are shown in FIG. 9A. FIG. 9B and FIG. 9C respectively illustrate PLE patterns and PE patterns of $K_2TiF_6$:$Mn^{4+}$ phosphors of Preparation Examples 1-3 which were respectively obtained at 0° C., 25° C., and 50° C.

It can be observed from FIGS. 9B and 9C that the $K_2TiF_6$:$Mn^{4+}$ phosphor obtained at a reaction temperature of 0° C. has the highest luminous efficiency. Also, it can be clearly observed from FIG. 9C that the emission light of the $K_2TiF_6$:$Mn^{4+}$ phosphor shows a peak at 600 nm to 650 nm.

In addition, the quantum output efficiencies of $K_2TiF_6$:$Mn^{4+}$ phosphors of Preparation Examples 1-3 were measured. The results are shown in Table 1.

TABLE 1

| Sample | Reaction temperature | $QY_{IN}$ (%) | $QY_{EX}$ (%) |
|---|---|---|---|
| Preparation Example 1 | 0° C. | 77 | 50 |
| Preparation Example 2 | 25° C. | 46 | 31 |
| Preparation Example 3 | 50° C. | 76 | 33 |

As shown in Table 1, the $K_2TiF_6$:$Mn^{4+}$ phosphor obtained at a reaction temperature of 0° C. has the highest quantum output efficiency.

Preparation Examples 4-7: Fabricating $K_2TiF_6$:$Mn^{4+}$ Phosphors by Adding Different Surfactants The same procedure described in Preparation Example 1 was repeated, except that no surfactant was added in Preparation Example 4, 1 g of cationic surfactant cetrimonium bromide (CTAB; $(C_{16}H_{33})N(CH_3)_3Br$) was added in Preparation Example 5 and dissolved together with titanium isopropoxide ($TiC_{12}H_{28}O_4$) in isopropanol, 1 g of nonionic surfactant oleic acid ($C_{18}H_{34}O_2$) was added in Preparation Example 6 and dissolved together with titanium isopropoxide ($TiC_{12}H_{28}O_4$) in isopropanol, and 1 g of anionic surfactant sodium dodecyl sulfate (SDS; $NaC_{12}H_{25}SO_4$) was added in Preparation Example 7 and dissolved together with titanium isopropoxide ($TiC_{12}H_{28}O_4$) in isopropanol.

Figure 10:
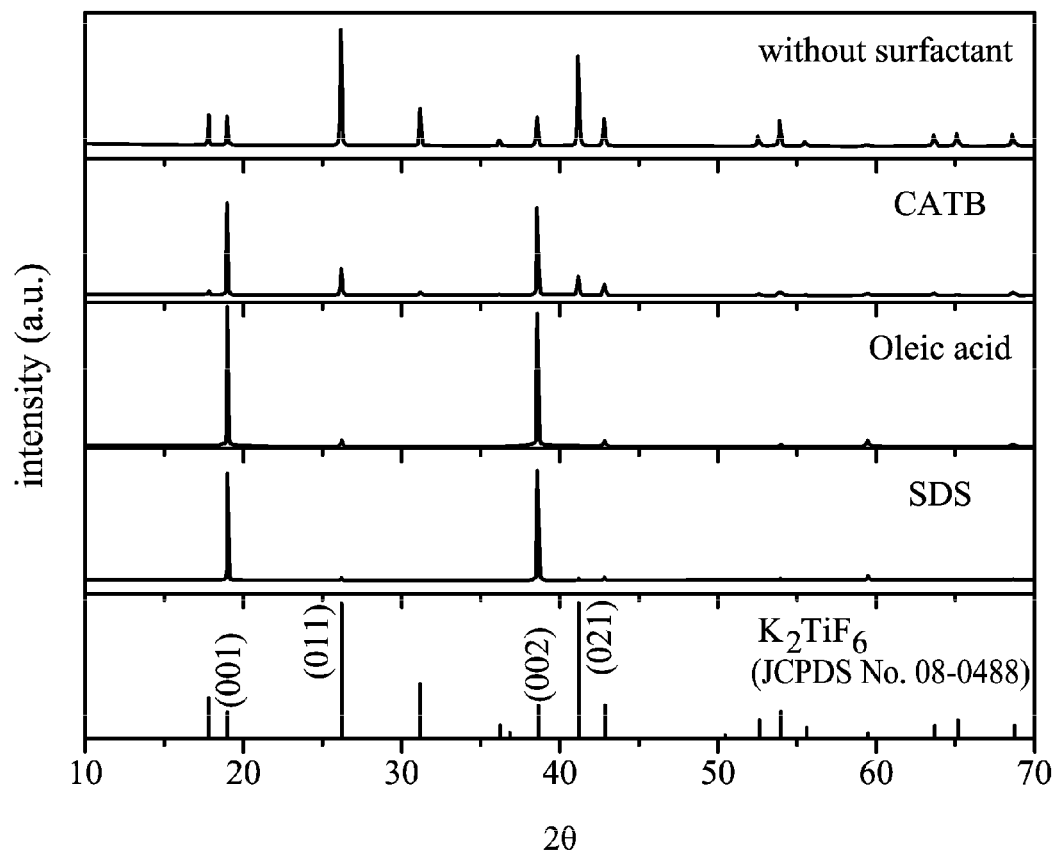
FIG. 10A illustrates X-ray diffraction (XRD) patterns of $K_2TiF_6$:$Mn^{4+}$ phosphor obtained by adding different surfactants in accordance with some embodiments of the present disclosure.
FIG. 10B and FIG. 10C respectively illustrates PLE patterns and PE patterns of $K_2TiF_6$:$Mn^{4+}$ phosphor obtained by adding different surfactants in accordance with some embodiments of the present disclosure.
FIGS. 10D-10J illustrate the surface morphologies of $K_2TiF_6$:$Mn^{4+}$ phosphor obtained by adding different surfactants in accordance with some embodiments of the present disclosure.
Figure 10:
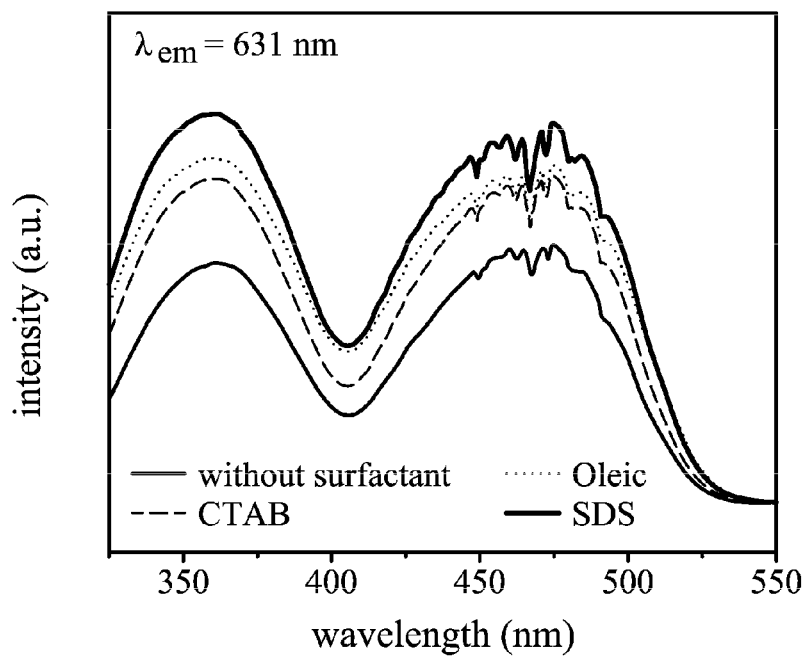
Figure 10:
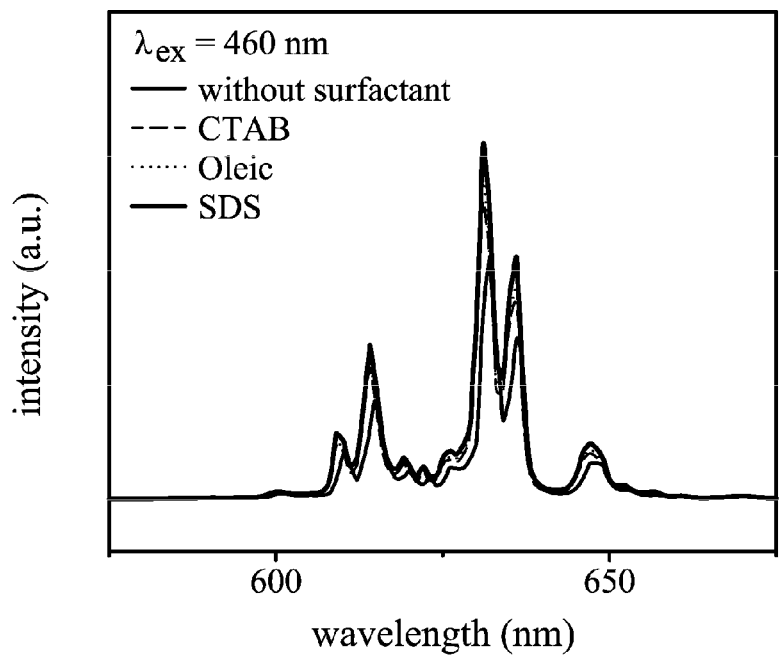

The X-ray diffraction (XRD) patterns of $K_2TiF_6:Mn^{4+}$ phosphors of Preparation Examples 4-7 which were obtained by adding different surfactants were recorded with an X-ray powder diffractometer. The results are shown in FIG. 10A. FIG. 10B and FIG. 10C respectively illustrate PLE patterns and PE patterns of $K_2TiF_6:Mn^{4+}$ phosphors of Preparation Examples 4-7 which were obtained by adding different surfactants.

The last row of FIG. 10A shows the standard pattern from the Joint Committee on Powder Diffraction Standards (JCPDS). It can be observed from FIG. 10A that the X-ray diffraction (XRD) patterns of the phosphor formed without adding surfactants was similar to the standard pattern. However, the X-ray diffraction (XRD) patterns of phosphors formed in Preparation Examples 5-7 were significantly changed in peaks of (001) and (011). In the standard pattern, the peak of (001) is weaker than that of (011). However, in the X-ray diffraction (XRD) patterns of phosphors formed in Preparation Examples 5-7, the peaks of (001) are stronger than that of (011).

It can be observed from FIGS. 10B and 10C that the $K_2TiF_6:Mn^{4+}$ phosphor obtained by adding anionic surfactant sodium dodecyl sulfate (SDS) has the highest luminous efficiency. Also, it can be clearly observed from FIG. 10C that the emission light of the $K_2TiF_6:Mn^{4+}$ phosphor shows a peak at 600 nm to 650 nm.

Figure 10G:
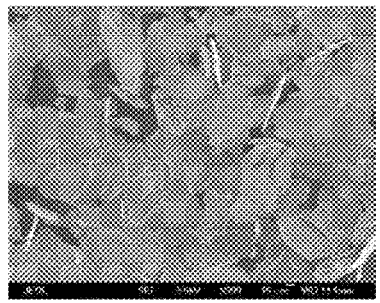
Figure 10H:
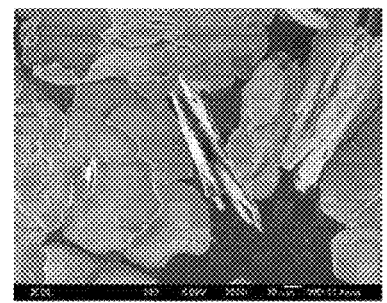
Figure 10I:
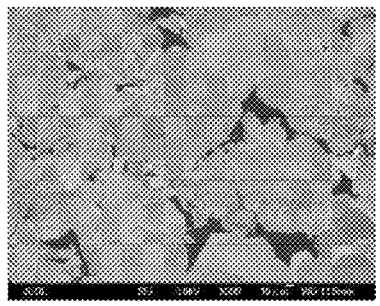
Figure 10J:
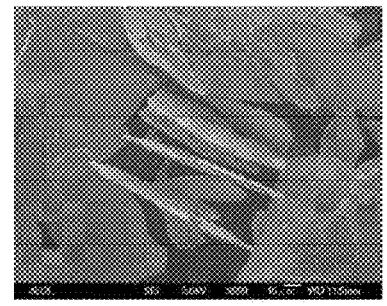

In addition, the surface morphologies of $K_2TiF_6:Mn^{4+}$ phosphors of Preparation Examples 4-7 were observed. FIG. 10D illustrates the surface morphology of the $K_2TiF_6:Mn^{4+}$ phosphor of Preparation Example 4 which was formed without adding surfactants. FIGS. 10E-10F illustrate the surface morphology of the $K_2TiF_6:Mn^{4+}$ phosphor of Preparation Example 5 which was obtained by adding cationic surfactant cetrimonium bromide (CTAB; $(C_{16}H_{33})N(CH_3)_3Br$). FIGS. 10G-10H illustrate the surface morphology of the $K_2TiF_6:Mn^{4+}$ phosphor of Preparation Example 6 which was obtained by adding nonionic surfactant oleic acid ($C_{18}H_{34}O_2$). FIGS. 10I-10J illustrate the surface morphology of the $K_2TiF_6:Mn^{4+}$ phosphor of Preparation Example 7 which was obtained by adding anionic surfactant sodium dodecyl sulfate (SDS; $NaC_{12}H_{25}SO_4$).

It can be observed from FIGS. 10D, 10E, 10G, and 10I that, the macroscopic surface morphology of the phosphor formed without adding surfactants was dispersed and shattered sheet (FIG. 10D), while the macroscopic surface morphology of the phosphor obtained by adding surfactants was intact sheet. Moreover, it can be observed from FIGS. 10F, 10H, and 10J that, microscopically, the phosphor obtained by adding surfactants grows toward a specific preferred orientation. As shown in FIG. 10B and FIG. 10C, the phosphor obtained by adding surfactants, which has more intact sheet morphology, has better luminous efficiency.

The quantum output efficiency of $K_2TiF_6:Mn^{4+}$ phosphors of Preparation Examples 4-7 were measured. The results are shown in Table 2. The commercial $K_2TiF_6$ (YA21) was bought from China Economic News Service (CENS).

TABLE 2

| Sample | Surfactant (mol/L) | Surfactant species | (001)/(011) | $QY_{IN}$ (%) | $QY_{EX}$ (%) |
|---|---|---|---|---|---|
| Commercial $K_2TiF_6$ | — | — | — | 90 | 70 |
| Preparation Example 4 | — | — | 0.27 | 77 | 50 |
| Preparation Example 5 | CTAB | cationic | 3.4 | 73 | 58 |
| Preparation Example 6 | Oleic acid | nonionic | 22.5 | 80 | 64 |
| Preparation Example 7 | SDS | anionic | 60.1 | 85 | 67 |

As shown in Table 2, compared to the quantum output efficiency (50%) of the phosphor of Preparation Example 4 which was form without adding surfactants, the quantum output efficiency (58%, 64%, 67%) of the phosphor of Preparation Examples 5-7 which were obtained by adding surfactants were improved. In particular, the quantum output efficiency of the phosphor obtained by adding anionic surfactants sodium dodecyl sulfate (SDS) is similar to that of the commercial $K_2TiF_6$ phosphor.

Preparation Examples 8-13: Fabricating $K_2TiF_6$:$Mn^{4+}$ Phosphors by Adding Different Concentrations of Anionic Surfactant (SDS)

The same procedure described in Preparation Example 1 was repeated, except that no surfactant was added in Preparation Example 8, 1 g of sodium dodecyl sulfate (SDS) was added in Preparation Example 5 and dissolved together with titanium isopropoxide ($TiCl_{12}H_{28}O_4$) in isopropanol (equivalent to 0.5 mol/L of SDS), 2 g of sodium dodecyl sulfate (SDS) was added in Preparation Example 10 and dissolved together with titanium isopropoxide ($TiC_{12}H_{28}O_4$) in isopropanol (equivalent to 1 mol/L of SDS), 5 g of sodium dodecyl sulfate (SDS) was added in Preparation Example 11 and dissolved together with titanium isopropoxide ($TiC_{12}H_{28}O_4$) in isopropanol (equivalent to 3 mol/L of SDS), 10 g of sodium dodecyl sulfate (SDS) was added in Preparation Example 12 and dissolved together with titanium isopropoxide ($TiC_{12}H_{28}O_4$) in isopropanol (equivalent to 5 mol/L of SDS), and 20 g of sodium dodecyl sulfate (SDS) was added in Preparation Example 13 and dissolved together with titanium isopropoxide ($TiC_{12}H_{28}O_4$) in isopropanol (equivalent to 10 mol/L of SDS).

Figure 11:
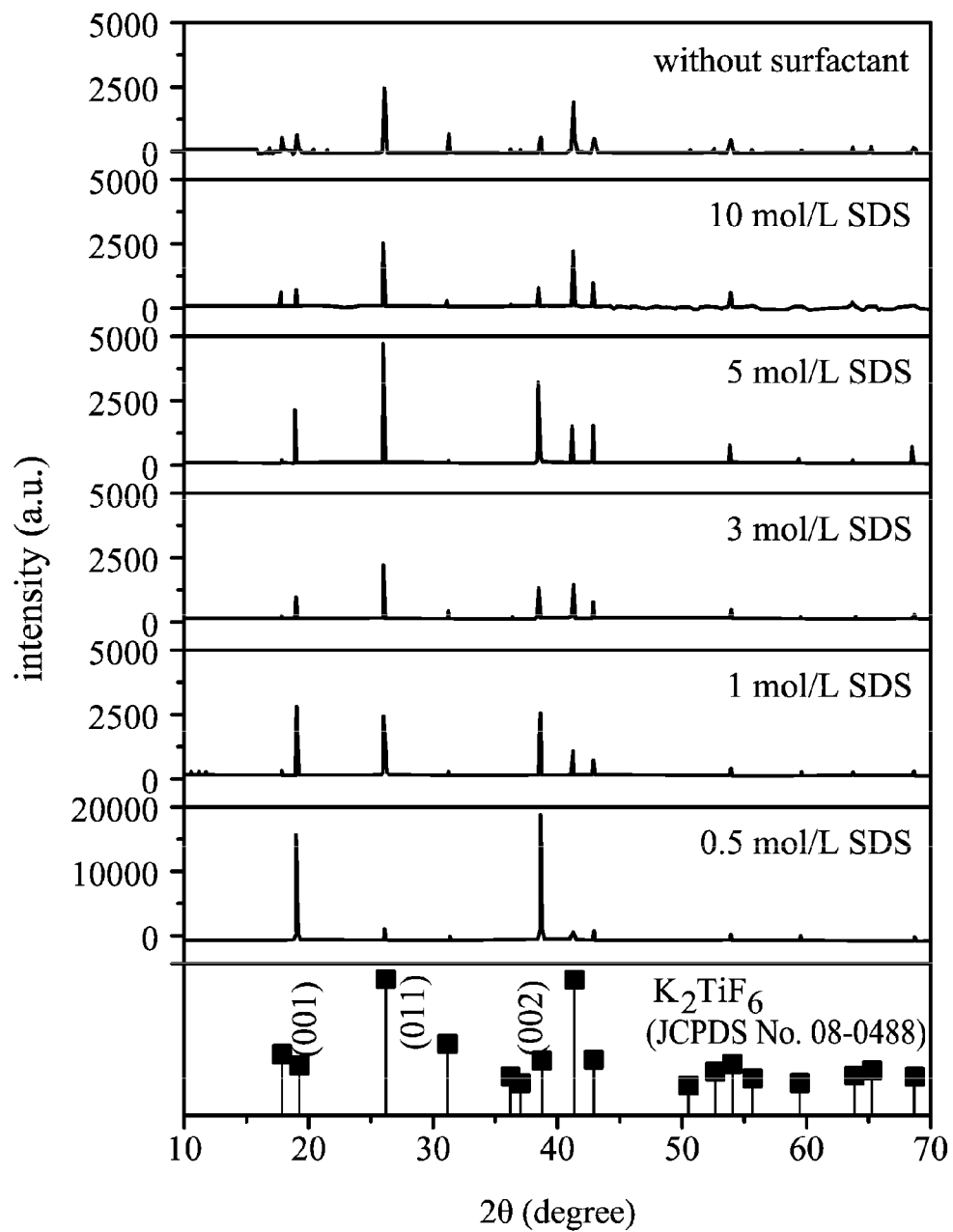
FIG. 11A illustrates X-ray diffraction (XRD) patterns of $K_2TiF_6$:$Mn^{4+}$ phosphor obtained by adding different concentrations of anionic surfactants (SDS) in accordance with some embodiments of the present disclosure.
FIG. 11B and FIG. 11C respectively illustrates PLE patterns and PE patterns of $K_2TiF_6$:$Mn^{4+}$ phosphor obtained by adding different concentrations of anionic surfactants (SDS) in accordance with some embodiments of the present disclosure.
FIGS. 11D-11I illustrate the surface morphologies of $K_2TiF_6$:$Mn^{4+}$ phosphor obtained by adding different concentrations of anionic surfactants (SDS) in accordance with some embodiments of the present disclosure.
Figure 11:
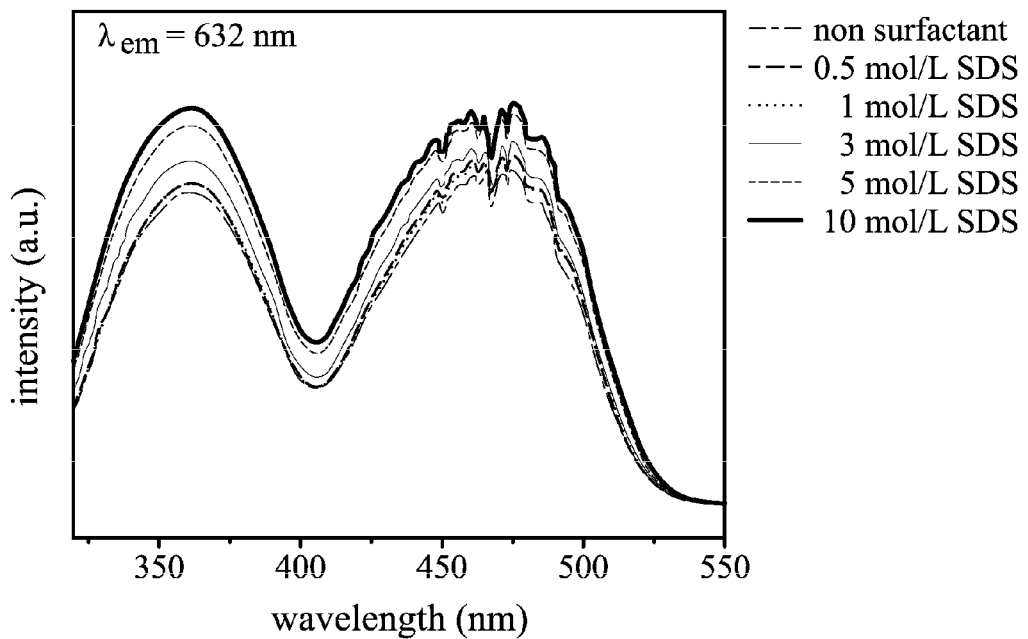
Figure 11:
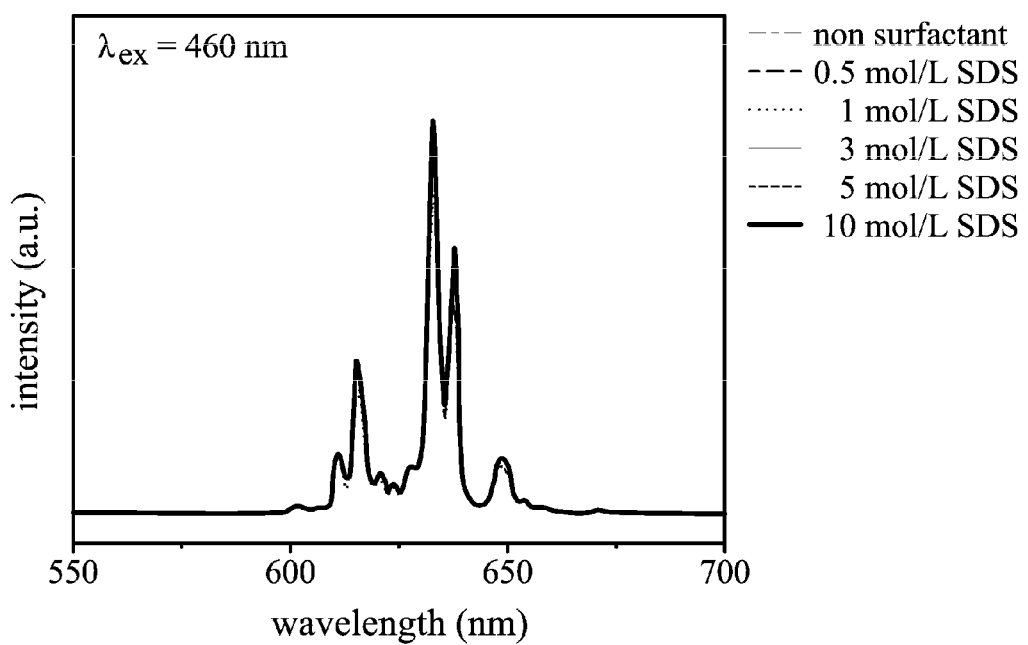
Figure 11D:
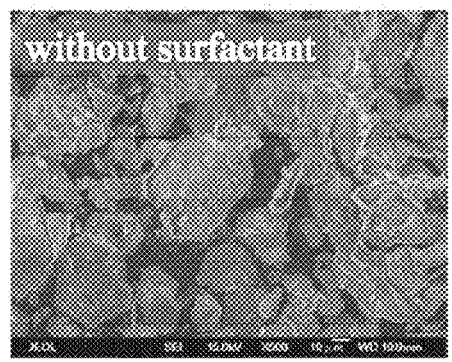
Figure 11E:
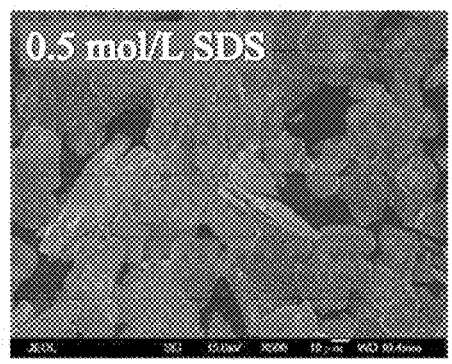
Figure 11F:
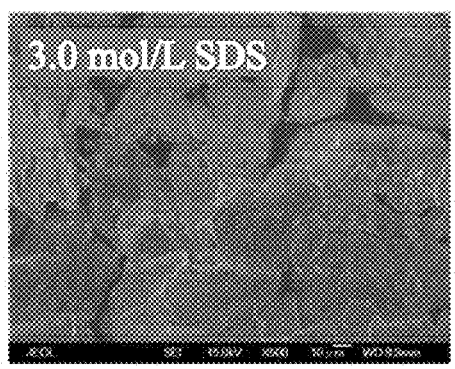

The X-ray diffraction (XRD) patterns of $K_2TiF_6:Mn^{4+}$ phosphors of Preparation Examples 8-13 which were obtained by adding different surfactants were recorded with an X-ray powder diffractometer. The results are shown in FIG. 11A. FIG. 11B and FIG. 11C respectively illustrate PLE patterns and PE patterns of $K_2TiF_6:Mn^{4+}$ phosphors of Preparation Examples 8-13 which were obtained by adding different concentrations of anionic surfactants (SDS).

The last row of FIG. 11A shows the standard pattern from the Joint Committee on Powder Diffraction Standards (JCPDS). It can be observed from FIG. 11A that the X-ray diffraction (XRD) pattern of the phosphor formed without adding surfactants was similar to the standard pattern. However, the X-ray diffraction (XRD) pattern of the phosphor formed in Preparation Example 9 (0.5 mol/L of SDS added) and Preparation Example 10 (1 mol/L of SDS added) was significantly changed in peaks of (001) and (011). In the standard pattern, the peak of (001) is weaker than that of (011). However, in the X-ray diffraction (XRD) patterns of phosphors formed in Preparation Examples 9-10, the peaks of (001) are stronger than that of (011).

It can be observed from FIGS. 11B and 11C that the $K_2TiF_6$:$Mn^{4+}$ phosphor obtained by adding 10 mol/L of anionic surfactant sodium dodecyl sulfate (SDS) has the highest luminous efficiency, and the $K_2TiF_6$:$Mn^{4+}$ phosphor obtained by adding 5 mol/L of anionic surfactant sodium dodecyl sulfate (SDS) has similar high luminous efficiency. Also, it can be clearly observed from FIG. 11C that the emission light of the $K_2TiF_6$:$Mn^{4+}$ phosphor shows a peak at 600 nm to 650 nm.

Although the $K_2TiF_6$:$Mn^{4+}$ phosphor of Preparation Example 9 (0.5 mol/L of SDS added) has the most significant change in peaks of (001) and (011) among $K_2TiF_6$:$Mn^{4+}$ phosphor of Preparation Examples 9-13, 5 mol/L of SDS was used in the following Preparation Examples due to considerations of the luminous efficiency and the yield.

Figure 11G:
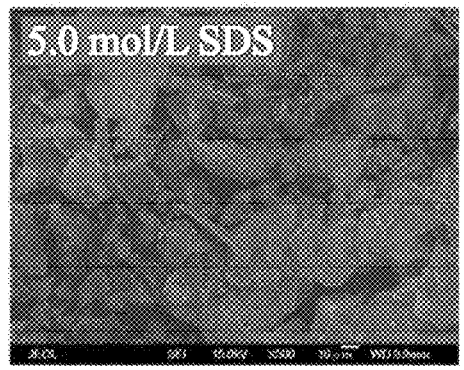
Figure 11H:
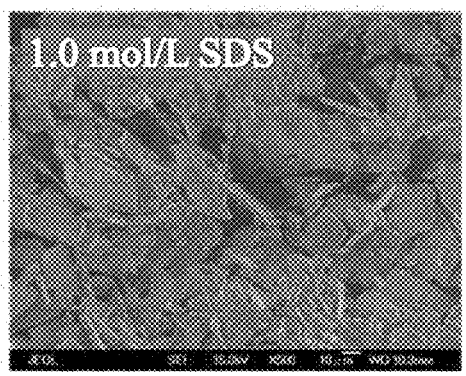
Figure 11I:
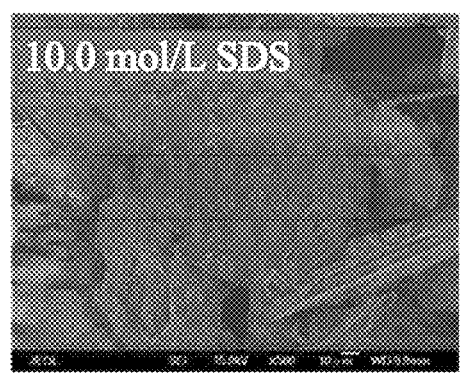

In addition, the surface morphologies of $K_2TiF_6$:$Mn^{4+}$ phosphors of Preparation Examples 8-13 were observed. FIGS. 11D-11I illustrate the surface morphology of the $K_2TiF_6$:$Mn^{4+}$ phosphor of Preparation Example 8 which was formed without adding surfactants and the surface morphologies of $K_2TiF_6$:$Mn^{4+}$ phosphors of Preparation Examples 9-13 which were obtained by adding 0.5 mol/L, 1 mol/L, 3 mol/L, 5 mol/L, and 10 mol/L of SDS. The result shown in FIG. 11G is the preferable surface morphology.

The quantum output efficiencies of $K_2TiF_6$:$Mn^{4+}$ phosphors of Preparation Examples 8-13 were measured. The results are shown in Table 3.

TABLE 3

| Sample | SDS (mol/L) | $QY_{IN}$ (%) | $QY_{EX}$ (%) |
| --- | --- | --- | --- |
| Preparation Example 8 | 0 | 77 | 50 |
| Preparation Example 9 | 0.5 | 71 | 51 |
| Preparation Example 10 | 1.0 | 79 | 54 |
| Preparation Example 11 | 3.0 | 83 | 54 |
| Preparation Example 12 | 5.0 | 79 | 56 |
| Preparation Example 13 | 10.0 | 75 | 58 |

As shown in Table 3, compared to the quantum output efficiency of the phosphor of Preparation Example 8 which was formed without adding surfactants, the quantum output efficiencies of phosphors of Preparation Examples 5-7 which were obtained by adding surfactants were improved. As the amount of anionic surfactant SDS increased from 0 mol/L to 10 mol/L, the quantum output efficiencies of the resulting phosphors improve from 50% to 58%.

Preparation Examples 14-19: Fabricating $K_2TiF_6$:$Mn^{4+}$ Phosphors by Adding Different Concentrations of $KHF_2$ The same procedure described in Preparation Example 1 was repeated, except that the amount of $KHF_2$ was increased to 0.3 g (equivalent to 4 mmol; 0.4 mol/L) in Preparation Example 14, the amount of $KHF_2$ was increased to 0.5 g (equivalent to 6 mmol; 0.7 mol/L) in Preparation Example 15, the amount of $KHF_2$ was increased to 0.8 g (equivalent to 10 mmol; 1.1 mol/L) in Preparation Example 16, the amount of $KHF_2$ was increased to 0.9 g (equivalent to 12 mmol; 1.3 mol/L) in Preparation Example 17, 1 g of $KHF_2$ (equivalent to 14 mmol; 1.3 mol/L) was still added in Preparation Example 18, and the amount of $KHF_2$ was increased to 1.5 g (equivalent to 18 mmol; 2 mol/L) in Preparation Example 19.

Figure 12:
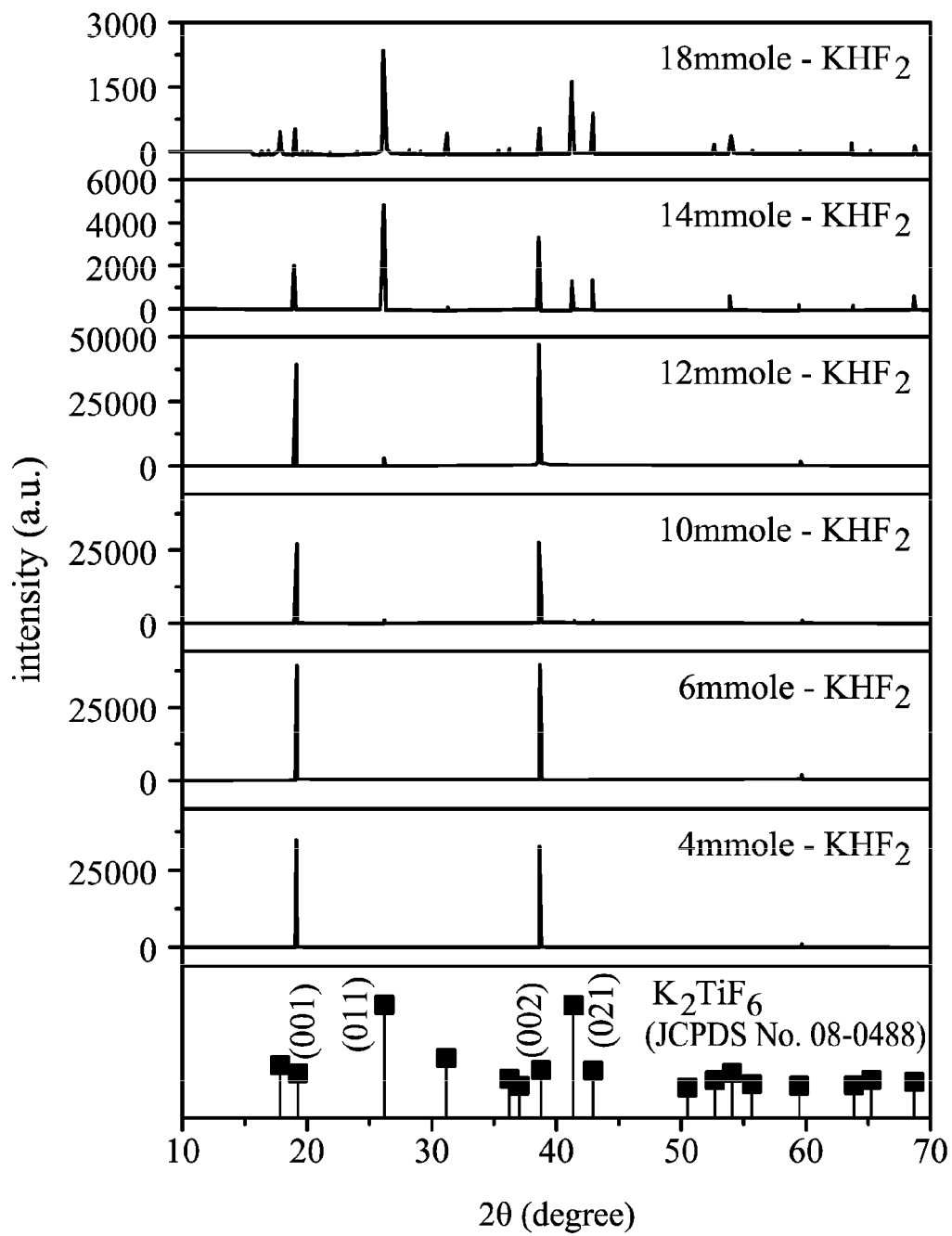
FIG. 12A illustrates X-ray diffraction (XRD) patterns of $K_2TiF_6$:$Mn^{4+}$ phosphor obtained by adding different concentrations of $KHF_2$ in accordance with some embodiments of the present disclosure.
FIG. 12B and FIG. 12C respectively illustrates PLE patterns and PE patterns of $K_2TiF_6$:$Mn^{4+}$ phosphor obtained by adding different concentrations of $KHF_2$ in accordance with some embodiments of the present disclosure.
Figure 12:
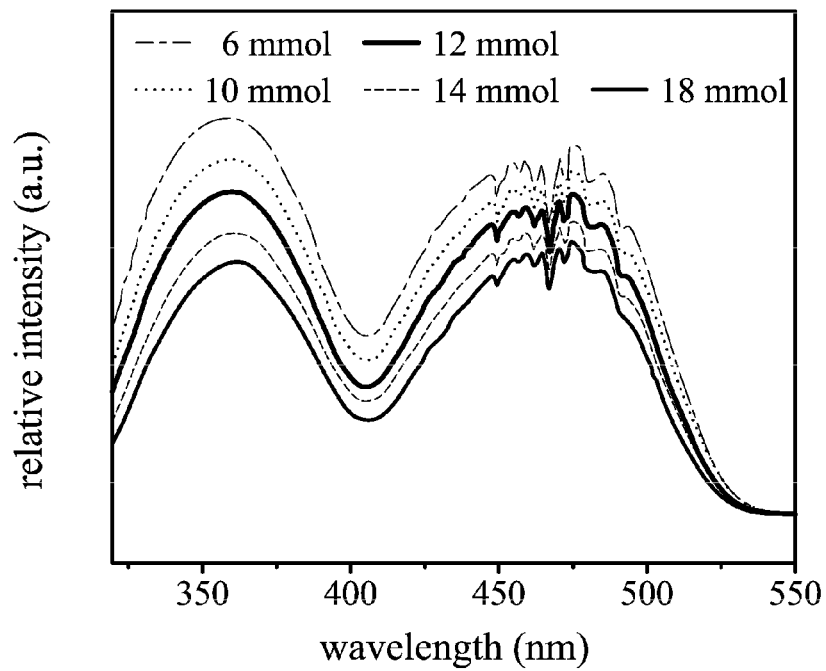
Figure 12:
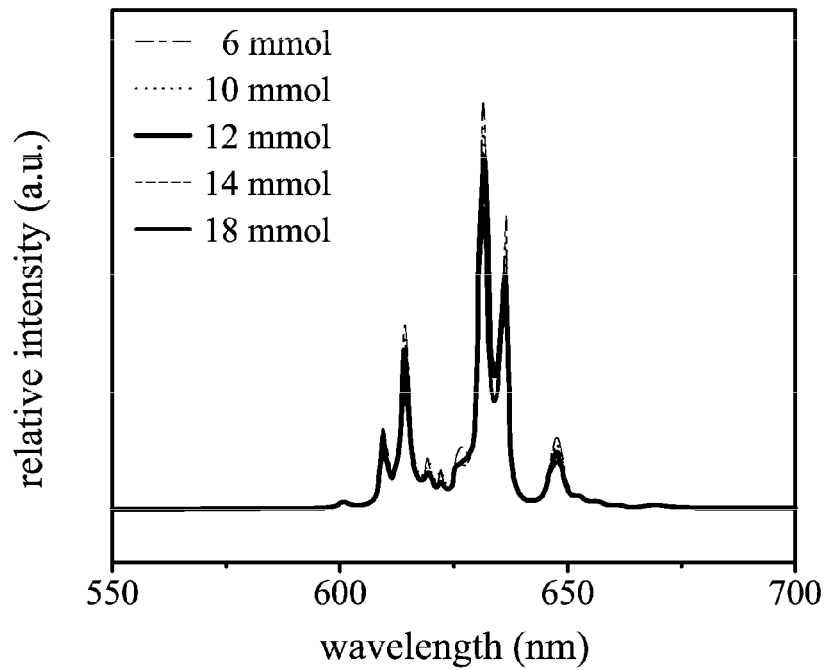

The X-ray diffraction (XRD) patterns of $K_2TiF_6$:$Mn^{4+}$ phosphors of Preparation Examples 14-19 which were obtained by adding different concentrations of $KHF_2$ were recorded with an X-ray powder diffractometer. The results are shown in FIG. 12A. FIG. 12B and FIG. 12C respectively illustrate PLE patterns and PE patterns of $K_2TiF_6$:$Mn^{4+}$ phosphors of Preparation Examples 14-19 which were obtained by adding different concentrations of $KHF_2$.

The last row of FIG. 12A shows the standard pattern from the Joint Committee on Powder Diffraction Standards (JCPDS). It can be observed from FIG. 12A that the X-ray diffraction (XRD) patterns of phosphors formed in Preparation Example 14-17 were significantly changed in peaks of (001) and (011). In the standard pattern, the peak of (001) is weaker than that of (011). However, in the X-ray diffraction (XRD) patterns of phosphors formed in Preparation Examples 14-17, the peaks of (001) are stronger than that of (011).

It can be observed from FIGS. 12B and 12C that the $K_2TiF_6$:$Mn^{4+}$ phosphor obtained by adding 6 mmol of $KHF_2$ (equivalent to 0.7 mol/L) has the highest luminous efficiency. Also, it can be clearly observed from FIG. 12C that the emission light of the $K_2TiF_6$:$Mn^{4+}$ phosphor shows a peak at 600 nm to 650 nm.

The quantum output efficiencies of $K_2TiF_6$:$Mn^{4+}$ phosphors of Preparation Examples 14-19 were measured. The results are shown in Table 4. The commercial $K_2TiF_6$ (YA21) was bought from China Economic News Service (CENS).

TABLE 4

| Sample | SDS (mol/L) | $KHF_2$ (mmole) | Reaction temperature | $QY_{IN}$ (%) | $QY_{EX}$ (%) |
| --- | --- | --- | --- | --- | --- |
| Commercial $K_2TiF_6$ | — | — | — | 90 | 70 |
| Preparation Example 14 | 0 | 14 | 0 | 77 | 50 |
| Preparation Example 14 | 5.0 | 18 | 0 | 67 | 47 |
| Preparation Example 15 | 5.0 | 14 | 0 | 79 | 56 |
| Preparation Example 16 | 5.0 | 12 | 0 | 80 | 59 |
| Preparation Example 17 | 5.0 | 10 | 0 | 82 | 62 |
| Preparation Example 18 | 5.0 | 6 | 0 | 85 | 67 |
| Preparation Example 19 | 5.0 | 4 | 0 | 80 | 64 |

As shown in Table 4, the $K_2TiF_6$:$Mn^{4+}$ phosphor obtained by adding 6 mmol of $KHF_2$ (equivalent to 0.7 mol/L) has the highest luminous efficiency (67%), which is similar to that of the commercial $K_2TiF_6$ phosphor.

Figure 13:
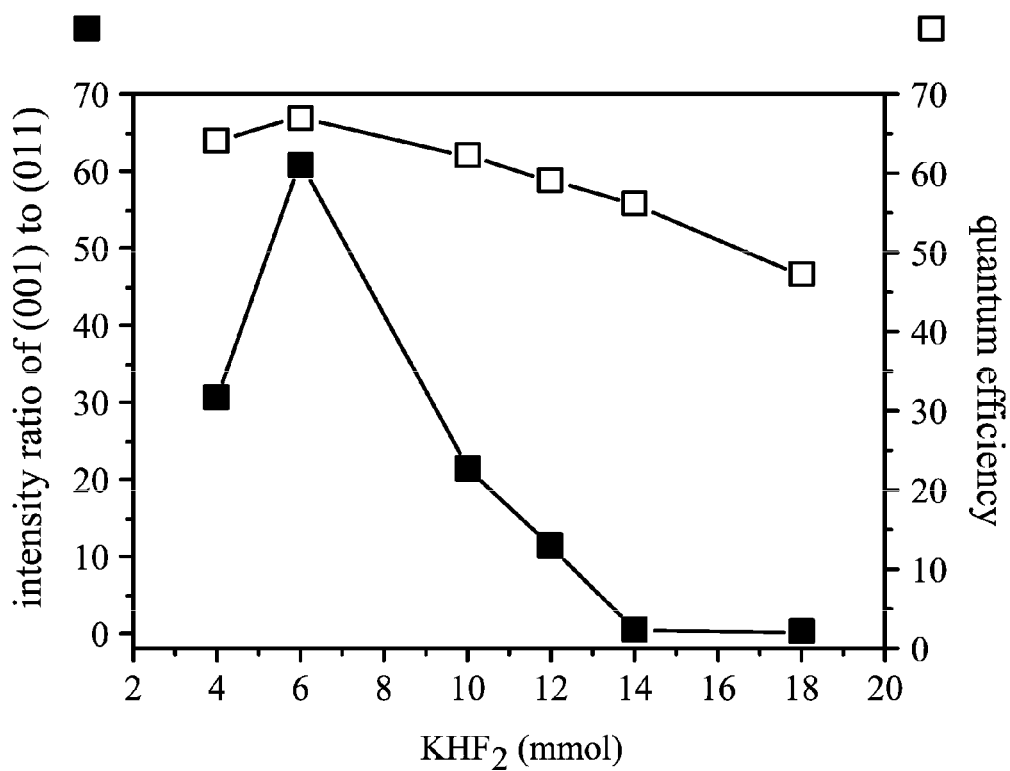
FIG. 13 illustrates the intensity ratio of (001)/(011) and quantum efficiency of $K_2TiF_6$:$Mn^{4+}$ phosphor obtained in some embodiments of the present disclosure.

The above results of Preparation Examples 14-19 were generalized in FIG. 13. It is observed that the $K_2TiF_6$:$Mn^{4+}$ phosphor obtained by adding 6 mmol of $KHF_2$ (equivalent to 0.7 mol/L) has the highest intensity ratio of (001)/(011) and the highest quantum output efficiency.

According to the above results of Preparation Examples 14-19, it was found that the $K_2TiF_6$:$Mn^{4+}$ phosphor obtained under conditions that included a reaction temperature of 0° C., 5% of anionic surfactant sodium dodecyl sulfate (SDS), and 6 mmol of $KHF_2$ (equivalent to 0.7 mol/L) has the highest intensity ratio of (001)/(011), quantum output efficiency, and luminous efficiency.

Example 1

Figure 14A:
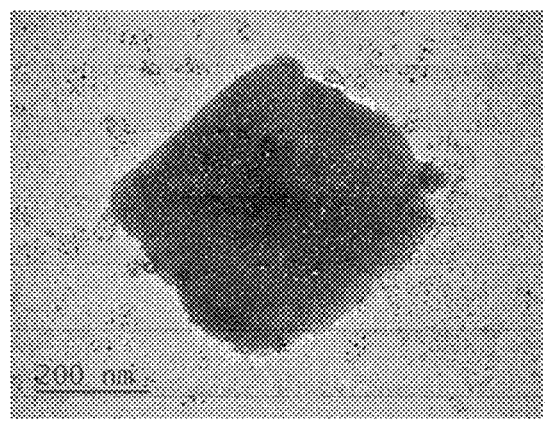
FIGS. 14A and 14B illustrate TEM images of $K_2TiF_6$:$Mn^{4+}$ phosphor obtained in some embodiments of the present disclosure.
Figure 14B:
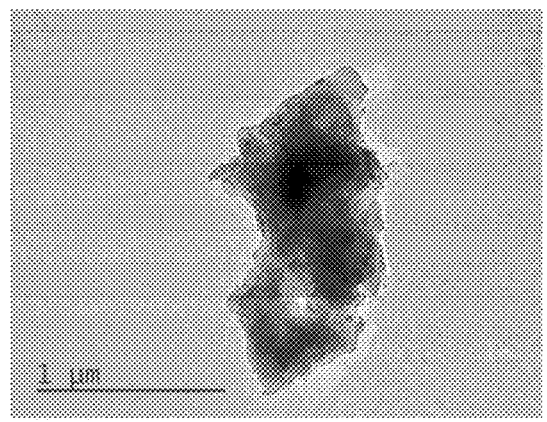
Figure 15A:
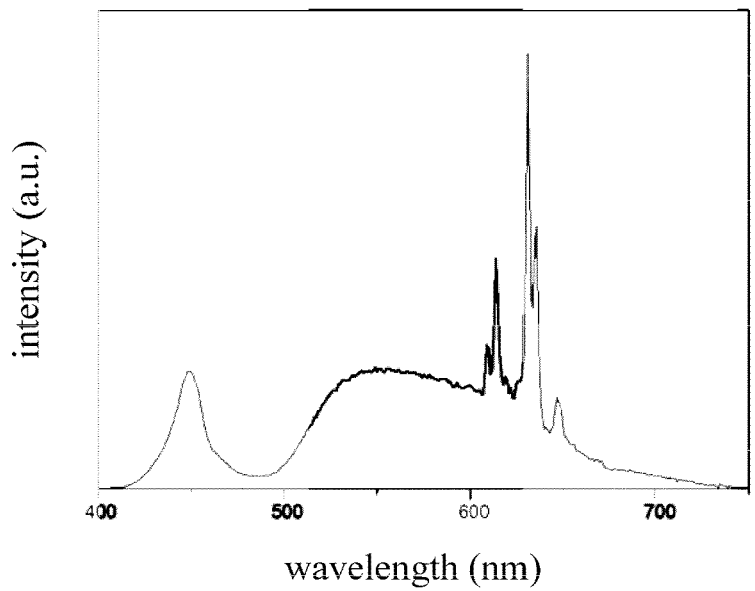
FIGS. 15A-15D illustrate EL patterns of light-emitting element package structures including $K_2TiF_6$:$Mn^{4+}$ phosphor obtained under different conditions.
Figure 15B:
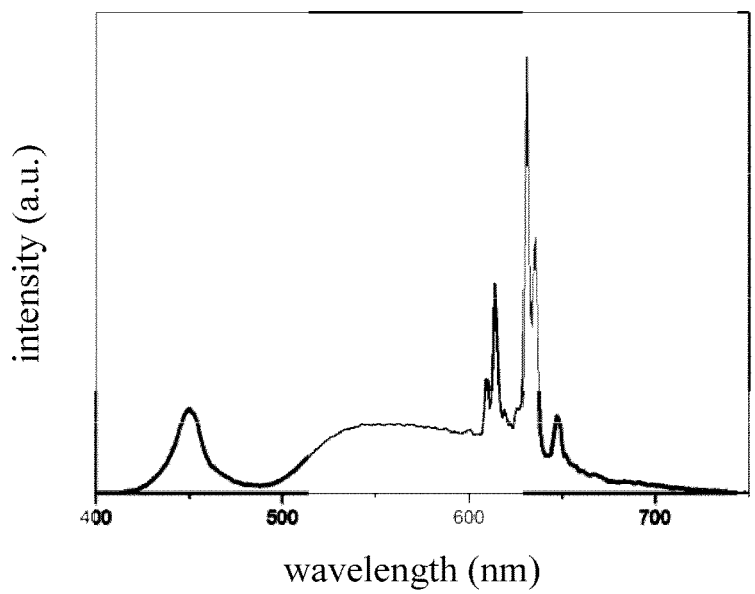
Figure 15C:
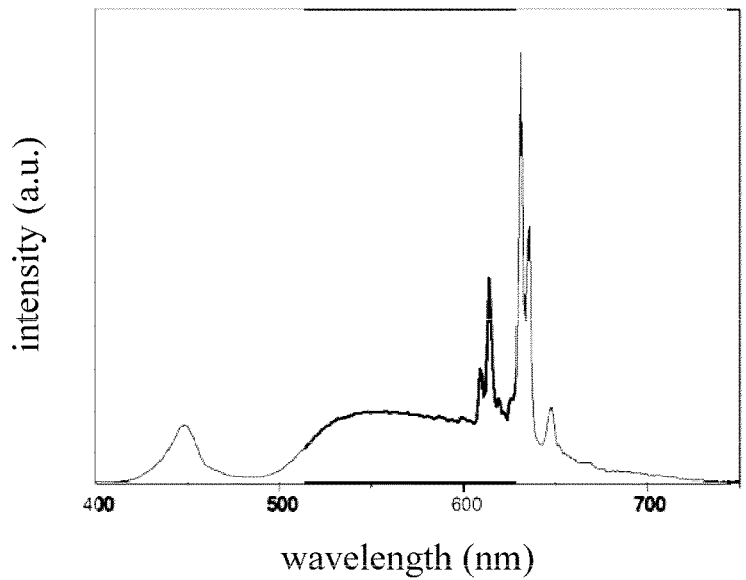
Figure 15D:
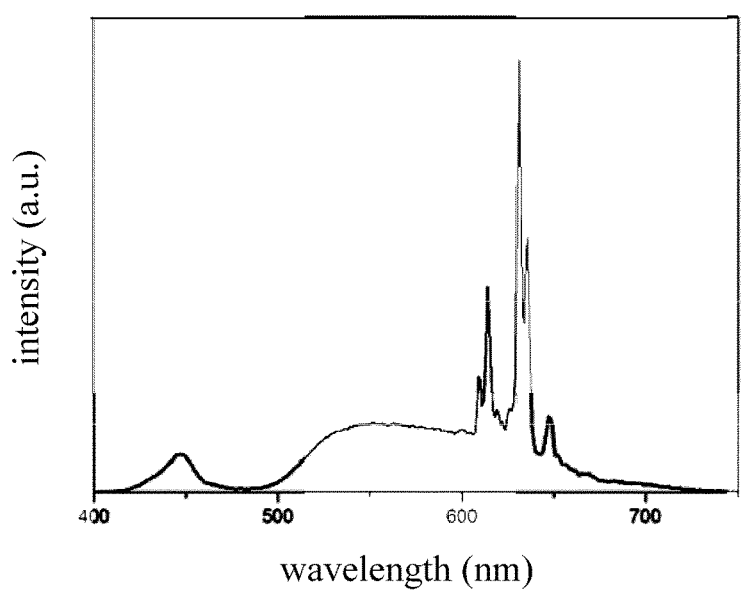

$K_2TiF_6:Mn^{4+}$ phosphor was prepared under the above conditions (as described in Preparation Example 18) and the TEM image thereof was recorded. FIGS. 14A and 14B illustrate TEM images of $K_2TiF_6:Mn^{4+}$ phosphor obtained in Example 1.

Example 2

A blue LED chip was accompanied by the YAG yellow light-emitting phosphor ($Y_3Al_5O_{12}$:Ce; Yttrium aluminum garnet) and the $K_2TiF_6:Mn^{4+}$ (KTFM) red light-emitting phosphor formed in Preparation Example 18 to produce white light. Table 5 illustrates the results of correlated color temperature (CCT), luminous efficiency (lm/W), color rendering index (CRI), and special color rendering index (R9) under different ratios of YAG:KTFM and different treatment times.

TABLE 5

| WLED | YAG:KTFM | Time (s) | CCT (K) | Luminous efficiency (lm/W) | Ra | R9 |
|---|---|---|---|---|---|---|
| YAG:Ce+ KTFM | 4:6 | 3 | 3507[a] | 81.52 | 83.6 | 89.0 |
|  |  | 4 | 3228 | 80.97 | 79.3 | 44.0 |
|  |  | 5 | 3096 | 78.59 | 79.6 | 42.0 |
| YAG:Ce+ KTFM | 3:7 | 4 | 2990[b] | 74.49 | 84.0 | 87.6 |
|  |  | 5 | 2862[c] | 73.31 | 87.4 | 95.0 |
|  |  | 6 | 2746[d] | 75.01 | 86.8 | 93.0 |
| YAG:Ce+ KTFM | 2:8 | 3 | 4146 | 60.36 | 0.0 | 61.0 |
|  |  | 4 | 2803 | 63.00 | 36.0 | 76.6 |

Correlated color temperature (CCT) relates to the color of light produced by a light source and uses the Kelvin temperature measurement scale (SI unit of absolute temperature). A higher CCT represents that the appearance of a white light source is cooler and bluer. A lower CCT represents that the appearance of a white light source is warmer and more comfortable. A CCT between 2500-4000K is called warm light. It can be observed from Table 5 that almost all of the CCTs of Examples are between the temperature range of warm light. The results reveal that the light sources of Examples are warm and comfortable and suitable for most occasions.

Color rendering index (Ra) is a quantitative measure of the ability of a light source to reveal the colors of various objects faithfully in comparison with a natural sun light. The value Ra is between 0-100. A higher value of Ra represents a better ability of a light source to reveal the colors of various objects faithfully in comparison with a natural light source. Special color rendering index (R9) represents the index of saturated red. It can be observed from Table 5 that the light sources including $K_2TiF_6:Mn^{4+}$ phosphors obtained under conditions (a)-(d) not only have a high luminous efficiency and a high color rendering index (Ra≥80), but also have excellent R9 values.

Figure 16:
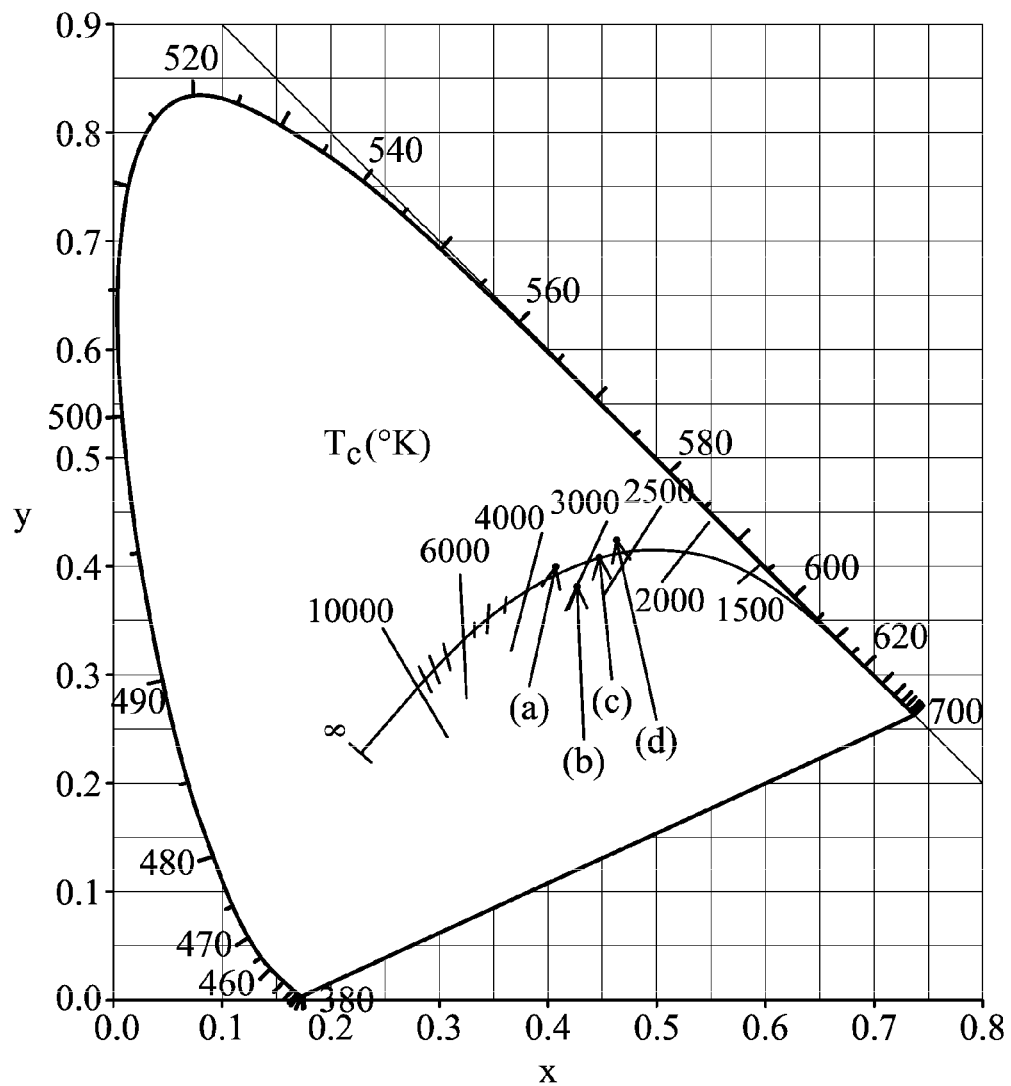
FIG. 16 illustrates actual chromaticity diagrams of spectrum data (a)-(d) in Table 5 obtained from the Commission Internationale de L'Éclairage (CIE) conversion software.

FIGS. 15A-15D illustrate EL patterns of light-emitting element package structures including $K_2TiF_6:Mn^{4+}$ phosphors obtained under conditions (a)-(d) recited in Table 5. It can be clearly observed from FIGS. 15A-15D that the phosphor shows a peak at 600-650 nm. In addition, FIG. 16 illustrates actual chromaticity diagrams of spectrum data (a)-(d) in Table 5 obtained from the Commission Internationale de L'Éclairage (CIE) conversion software.

From the above, a phosphor capable of increasing the color rendering index and a fabricating method thereof are provided. The present disclosure synthesizes a phosphor with a preferred orientation with high luminous efficiency and high quantum output through a sol-gel reaction by regulating temperature and adding surfactants. The resulting phosphor may be used to enable blue LEDs to produce a red fluorescence. Alternatively, the resulting phosphor may be applied to a blue LED chip accompanied by YAG yellow light-emitting phosphor ($Y_3Al_5O_{12}$:Ce; Yttrium aluminum garnet) and/or green light-emitting phosphor to produce white light and increase the color rendering index. Furthermore, the resulting phosphor may be applied to light-emitting element package structures and backlight modules.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor with a preferred orientation represented by the following formula:

$A_2[MF_6]:Mn^{4+}$, wherein A is selected from a group consisting of Li, Na, K, Rb, Cs, and $NH_4$, M is selected from a group consisting of Ge, Si, Sn, Ti, and Zr, wherein an intensity measured by an X-ray powder diffractometer of (001) oriented crystal surfaces is greater than that of (011) oriented crystal surfaces in the preferred orientation of the phosphor.

2. The phosphor with a preferred orientation as claimed in claim 1, wherein the formula is $K_2[TiF_6]:Mn^{4+}$.

3. The phosphor with a preferred orientation as claimed in claim 1, wherein a ratio of the intensity measured by an X-ray powder diffractometer of (001) oriented crystal surfaces relative to (011) oriented crystal surfaces in the preferred orientation of the phosphor is greater than 10.

4. The phosphor with a preferred orientation as claimed in claim 1, wherein the phosphor emits a red light having a peak wavelength in a range of about 600 nm to about 650 nm after being excited by a light having a peak wavelength in a range of about 300 nm to about 470 nm.

5. A light-emitting element package structure, comprising:
    a base;
    a light-emitting diode chip disposed in the base;
    a fluorescent layer covering the light-emitting diode chip, wherein a phosphor with a preferred orientation is dispersed in the fluorescent layer; and
    a conductive structure electrically connected to the light-emitting diode chip, a first electrode, and a second electrode,
    wherein the phosphor with a preferred orientation is the phosphor with a preferred orientation as claimed in claim 1.

6. The light-emitting element package structure as claimed in claim 5, further comprising a yellow light-emitting phosphor or a green light-emitting phosphor dispersed in the fluorescent layer.

7. The light-emitting element package structure as claimed in claim 5, further comprising a second fluorescent layer disposed above the light-emitting diode chip, wherein a yellow light-emitting phosphor or a green light-emitting phosphor is dispersed in the second fluorescent layer.

8. The light-emitting element package structure as claimed in claim 5, wherein the light-emitting element package structure comprises a plastic leaded chip carrier (PLCC), a chip scale package (CSP), an emitter package, a remote-type package, or a white well-type package.

* * * * *